(12) United States Patent
Isogai et al.

(10) Patent No.: US 6,931,718 B2
(45) Date of Patent: Aug. 23, 2005

(54) ELECTRI-COMPONENT HOLDING APPARATUS

(75) Inventors: Takeyoshi Isogai, Hekinan (JP); Hiroshi Katsumi, Chiryu (JP); Hisashi Kojima, Obu (JP); Masato Ando, Toyota (JP); Tetsuo Hayashi, Kariya (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 29 days.

(21) Appl. No.: 10/024,328

(22) Filed: Dec. 21, 2001

(65) Prior Publication Data

US 2002/0083584 A1 Jul. 4, 2002

(30) Foreign Application Priority Data

Dec. 28, 2000 (JP) ........................................ 2000-402920

(51) Int. Cl.[7] ............................................... B23P 19/00
(52) U.S. Cl. .............................. 29/743; 29/740; 29/759; 29/739; 29/721; 29/DIG. 44; 294/64.1
(58) Field of Search .................. 29/739–743, DIG. 44, 29/759, 721; 294/2, 64.1; 414/752.1, 737; 901/40

(56) References Cited

U.S. PATENT DOCUMENTS 6,161,886 A * 12/2000 Furuya et al. ............. 294/64.1
6,276,051 B1   8/2001 Asai et al.
6,493,927 B2  12/2002 Isogai et al.
6,705,000 B2 *  3/2004 Oe ............................... 29/743
6,735,853 B2 *  5/2004 Lee .............................. 29/739
2002/0083584 A1 * 7/2002 Isogai et al. .................. 29/743

FOREIGN PATENT DOCUMENTS

JP     A 11-214897     8/1999
JP     A 11-220294     8/1999

* cited by examiner

Primary Examiner—Minh Trinh
(74) Attorney, Agent, or Firm—Oliff & Berridge, PLC

(57) ABSTRACT

An electric-component holding apparatus including a component holder which holds an electric component and includes an engaging portion, a holder-holding member to which the component holder is detachably attached, a lock member which consists of a substantially rigid body, and which is supported by the holder-holding member such that the lock member is movable relative to the holder-holding member, and is engaged with the engaging portion of the component holder to lock the component holder to the holder-holding member, and a locked-state maintaining device which includes an operable member and an elastic member and which maintains, owing to an elastic force of the elastic member, a locked state in which the lock member is engaged with the engaging portion of the component holder.

13 Claims, 20 Drawing Sheets

ELECTRI-COMPONENT HOLDING APPARATUS

BACKGROUND OF THE INVENTION

1. Field of the Invention

The present invention relates to an electric-component holding apparatus which includes a holder-holding member and a component holder that is detachably attached to the holder-holding member and holds an electric component (e.g., electronic-circuit component or electronic component).

2. Discussion of Related Art

Generally, an electric-component (EC) holding apparatus includes a holder-holding member, and a component holder that is detachably attached to the holder-holding member. The EC holding apparatus may be attached to a movable member of an EC mounting device of an EC mounting system, and may be one which applies suction or negative pressure to an EC and thereby holds the EC, or one which includes a plurality of holding jaws to hold an EC. When the movable member is moved, the EC holding apparatus is moved to transfer the EC. In order that the component holder may be easily attached to, and detached from, the holder-holding member, an elastic member may be used. This elastic member can selectively take a removal preventing state in which the elastic member is engaged with both the component holder and the holder-holding member to prevent the component holder from removing from the holder-holding member, and a removal allowing state elastically deformed from the removal preventing state. If the component holder is moved relative to the holder-holding member by a force greater than a predetermined value in a direction in which the component holder may be attached to, and detached from, the holder-holding member, the elastic member is elastically deformed to allow the component holder to be attached to, or detached from, the holder-holding member. Thus, the component holder can be easily attached to, and detached from, the holder-holding member.

However, recently, it has been demanded to operate the EC mounting device at increased speeds to improve its EC mounting efficiency. Thus, the holder-holding member of the EC holding apparatus is started at increased accelerations and stopped at increased decelerations (i.e., negative accelerations). Therefore, the component holder may-come off the holder-holding member. More specifically described, the component holder is subjected to an inertia force equal to the product of an absolute value of an acceleration (or a deceleration) and a mass of the component holder, and thus the inertia force increases as the acceleration increases. When the inertia force overcomes the removal preventing force of the elastic member to prevent the component holder from removing from the holder-holding member, the component holder does remove from the holder-holding member. It is known that the phenomenon called "permanent set in fatigue" may occur to the elastic member because of increased times of use thereof or an increased time of lasting of elastic deformation thereof. In the latter case, the component holder is more likely to come off the holder-holding member. Moreover, if at least one of an engaging portion of the elastic member and an engaging portion of the component holder or the holder-holding member is worn out, then the component holder may be more likely to come off the holder-holding member.

While the above-described problems relate to the EC holding apparatus for use with the EC mounting system, the EC mounting apparatus encounters the same problems when the apparatus is used with various sorts of devices or systems that need to transfer ECs.

SUMMARY OF THE INVENTION

It is therefore an object of the present invention to prevent effectively a component holder from coming off a holder-holding member because of, e.g., a high acceleration or deceleration at which the holder-holding member is moved or stopped.

The above object may be achieved according to any one of the following features of the present invention in the form of an electric-component holding apparatus. Each of the following features of the invention is numbered like the appended claims and depends from the other feature or features, where appropriate, to indicate and clarify possible combinations of the features. It is to be understood that the present invention is not limited to the technical features or any combinations thereof that will be described for illustrative purposes only. It is to be further understood that a plurality of elements included in any one of the following features of the invention are not necessarily provided all together, and that the invention may be embodied without some of the elements described with respect to each of the features.

(1) According to a first feature of the present invention, there is provided an electric-component holding apparatus comprising a component holder which holds an electric component and which includes an engaging portion; a holder-holding member to which the component holder is detachably attached; a lock member which consists of a substantially rigid body, and which is supported by the holder-holding member such that the lock member is movable relative to the holder-holding member, and is engaged with the engaging portion of the component holder to lock the component holder to the holder-holding member; and a locked-state maintaining device which includes an operable member and an elastic member and which maintains, owing to an elastic force of the elastic member, a locked state in which the lock member is engaged with the engaging portion of the component holder, wherein the locked-state maintaining device does not allow, when a force is exerted to the component holder in a direction to cause the component holder to move away from the holder-holding member, the force to be exerted to the lock member in a direction to increase an amount of elastic deformation of the elastic member, and allows, when an operating force is applied to the operable member in the direction to increase the amount of elastic deformation of the elastic member, the lock member to be disengaged from the engaging portion of the component holder and unlocked from the locked state.

Unless an operating force is applied to the operable member of the locked-state maintaining device to unlock the lock member from the locked state in which the lock member is engaged with the engaging portion of the component holder, the lock member is not allowed to be disengaged from the engaging portion of the component holder. Therefore, even if the holder may be moved or stopped at an acceleration having a great absolute value, the component holder is effectively prevented from coming off the holder-holding member. In addition, the elastic force of the elastic member keeps the lock member engaged with the engaging portion of the component holder and, when the operable member is subjected to a force overcoming the elastic force of the elastic member, the lock member is disengaged from the engaging portion and accordingly the component holder is allowed to be removed from the holder-holding member. Even if a force may be exerted to the component holder in a direction to cause the component holder to be attached to, and detached from, the holder-holding member, the force is not exerted to the lock member in a direction to increase the amount of elastic deformation of the elastic member, i.e., cause the lock member to be disengaged from the engaging portion. Thus, the locked state can be maintained with high reliability, and the present apparatus can be produced at low cost.

(2) According to a second feature of the present invention that includes the first feature (1), the component holder comprises a suction nozzle which applies a negative pressure to the electric component and thereby holds the component.

(3) According to a third feature of the present invention that includes the first feature (1), the component holder comprises a plurality of holding jaws which cooperate with each other to hold the electric component.

The holding jaws may be attached to, or detached from, the holder-holding member, either directly or indirectly via a jaw-holding member that holds the holding jaws such that the holding jaws are operable to hold the electric component. In the latter case, the jaw-holding member may be attached to, or detached from, the holder-holding member.

(4) According to a fourth feature of the present invention that includes any one of the first to third features (1) to (3), the holder-holding member comprises a cylindrical portion which has an inner fitting hole and additionally has a through-hole radially formed therethrough to open, at an inner one of opposite open ends thereof, in the inner fitting hole, and the component holder comprises a fitting shank which is fitable in the inner fitting hole of the holder-holding member and which has an engaging recess as the engaging portion of the component holder, wherein the lock member is held in the through-hole of the cylindrical portion such that the lock member is movable in the through-hole in an axial direction of the through-hole parallel to an axis line thereof and is substantially immovable in a direction perpendicular to the axial direction, and the lock member has a dimension which assures that the lock member can simultaneously project out of both the opposite open ends of the through-hole, and wherein the locked-state maintaining device comprises (a) a sleeve which moveably fits on an outer circumferential surface of the cylindrical portion of the holder-holding member, and is movable to an operative position thereof in which the sleeve faces the through-hole and keeps the lock member engaged with the engaging recess of the component holder, and to a retracted position thereof in which the sleeve allows the lock member to be disengaged from the engaging recess, (b) the elastic member which biases the sleeve to the operative position thereof, and (c) the operable member which receives the operating force to move the sleeve to the retracted position thereof against the elastic force of the elastic member.

When the sleeve receives the force overcoming the elastic force of the elastic member, the sleeve is moved to its retracted position and accordingly the component holder is allowed to be removed from the holder-holding member. The sleeve may be adapted to be movable in a direction having both a first component in the axial direction of the cylindrical portion of the holder-holding member and a second component in a circumferential direction of the cylindrical portion. However, usually, the sleeve is adapted to be movable in only one of the axial direction and the circumferential direction. In the latter case, the sleeve can be attached to the component-holder member by an attaching device having a simple construction. An embodiment in which the sleeve is fitted on an outer circumferential surface of the cylindrical portion of the holder-holding member such that the sleeve is movable in the axial direction of the cylindrical portion is a representative one of various embodiments in which the sleeve is movable in a direction having the above-indicated first component; and an embodiment in which the sleeve having a circular transverse cross section is fitted on the outer circumferential surface of the cylindrical portion of the holder-holding member such that the sleeve is rotatable is a representative one of various embodiments in which the sleeve is movable in a direction having the above-indicated second component. The sleeve may be moved to its retracted position, either manually by an operator or automatically by an operating device. In the latter case, the operating device may be either part of the electric-component holding apparatus, or independent of the same.

(5) According to a fifth feature of the present invention that includes the fourth feature (4), the lock member comprises a ball which has a diameter greater than a length of the through-hole.

Though the lock member may be provided in the form of a lock pin that movably fits in the through-hole, the lock member that is provided in the form of a ball can operate with higher stability. In addition, a commercially available product such as a steel ball may be used as the lock member.

(6) According to a sixth feature of the present invention that includes the fourth or fifth feature (4) or (5), the operable member is integral with the sleeve.

(7) According to a seventh feature of the present invention that includes any one of the first to third features (1) to (3), the holder-holding member has a fitting hole and additionally has a holding hole which crosses the fitting hole while partly overlapping, in space, the fitting hole, and the component holder comprises a fitting shank which is fitable in the fitting hole of the holder-holding member and which has an engaging recess as the engaging portion of the component holder, wherein the lock member comprises a lock bar which is held in the holding hole of the holder-holding member such that the lock bar is movable in the holding hole in an axial direction of the holding hole parallel to an axis line thereof, and is substantially immovable in a direction perpendicular to the axial direction, and the lock bar is movable to an operative position thereof in which the lock bar is engaged with the engaging recess of the component holder, and to a retracted position thereof in which the lock bar is disengaged from the engaging recess, and wherein the locked-state maintaining device comprises (a) the elastic member which biases the lock bar to the operative position thereof, and (b) the operable member which receives the operating force to move the lock bar to the retracted position thereof against the elastic force of the elastic member.

According to this feature, the lock member is provided in the form of a lock bar. When the lock bar is moved to its operative position and its retracted position, the present apparatus is switched to its locked state and its unlocked state, respectively. Since the elastic force of the elastic member biases the lock bar to its operative position, the locked state can be maintained with high reliability, and the present apparatus can be produced at low cost. The lock bar may be moved to its retracted position, either manually by an operator or automatically by an operating device.

(8) According to an eighth feature of the present invention that includes the seventh feature (7), the lock bar comprises a lock pin which has a circular transverse cross section.

(9) According to a ninth feature of the present invention that includes the seventh or eighth feature (7) or (8), the operable member is integral with the lock bar.

The operable member may be produced as an integral portion of the lock bar, or may be produced as a member separate from the lock bar and then fixed to the same.

(10) According to a tenth feature of the present invention that includes any one of the first to third features (1) to (3), the holder-holding member comprises one of a fitting hole and a fitting shank fitable in the fitting hole, and the component holder comprises the other of the fitting hole and the fitting shank, wherein the lock member comprises a lock lever which is supported by the holder-holding member such that the lock lever is pivotable, about an axis line perpendicular to a common line of the fitting hole and the fitting shank, to an operative position thereof in which the lock lever is engaged with the engaging portion of the component holder to prevent the component holder from moving away from the holder-holding member, and to a retracted position thereof in which the lock lever is disengaged from the engaging portion, and wherein the locked-state maintaining device comprises (a) the elastic member which biases the lock lever to the operative position thereof, and (b) the operable member which receives the operating force to move the lock lever to the retracted position thereof against the elastic force of the elastic member.

According to this feature, the lock member is provided in the form of a lock lever. Since the lock lever is pivotable about an axis line to its operative position and its retracted position, the lock lever can be produced at low cost and can maintain the locked state with high reliability. The lock lever may be moved to its retracted position, either manually by an operator or automatically by an operating device.

(11) According to an eleventh feature of the present invention that includes the tenth feature (10), the operable member is integral with the lock lever.

The operable member may be produced as an integral portion of the lock lever, or may be produced as a member separate from the lock bar and then fixed to the same.

(12) According to a twelfth feature of the present invention that includes any one of the fourth to eleventh features (4) to (11), the fitting hole comprises a tapered hole having an inner tapered surface, and the fitting shank comprises a tapered shank having an outer tapered surface which is fitable in the inner tapered surface of the tapered hole.

In the case where the fitting hole is provided by a tapered hole, the fitting shank is provided by a tapered shank, and the tapered shank is tightly fitted in the tapered hole, the component holder can be fitted in the holder-holding member with high concentricity.

(13) According to a thirteenth feature of the present invention, there is provided an electric-component holding apparatus comprising a holder-holding member; two moving members which is supported by the holder-holding member such that the two moving members are movable toward, and away from, each other; two holding jaws which are attached to the two moving members, respectively, and cooperate with each other to hold an electric component; two attaching devices which attach the two holding jaws to the two moving members, respectively; and a drive device which moves the two moving members toward, and away from, each other, wherein each one of the two attaching devices comprises (a) a fitting recess and a fitting projection fitable in the fitting recess, one of the fitting recess and the fitting projection of the each one of the two attaching devices being provided by a corresponding one of the two moving members, the other of the fitting recess and the fitting projection of the each one of the two attaching devices being provided by a corresponding one of the two holding jaws, and (b) a lock device which is normally held in a locked state thereof in which the lock device prevents the fitting recess and the fitting projection of the each one of the two attaching devices from moving away from each other and is unlocked from the locked state thereof by a special movement of at least one of the two moving members over a predetermined range of distance therebetween.

According to this feature, the locked state in which the fitting recess and the fitting projection are prevented from being moved away from each other is unlocked by utilizing a special movement of the two moving members toward, or away from, each other. That is, the drive device that moves the two moving members toward, and away from, each other can be used as a drive device that unlocks the locked state. Thus, the present electric-component holding apparatus can enjoy a simple construction and accordingly can be produced at low cost.

(14) According to a fourteenth feature of the present invention that includes the thirteenth feature (13), the fitting recess of the each one of the two attaching devices comprises a fitting hole which is formed in the one of the two moving members, and the fitting projection of the each one of the two attaching devices comprises a fitting shank which is fitable in the fitting hole and which is provided by the one of the two holding jaws, and wherein the lock device of the each one of the two attaching devices comprises an engaging recess which is formed in the fitting shank provided by the one of the two holding jaws, a holding hole which is formed in the one of the two moving members such that the holding hole crosses the fitting hole while partly overlapping, in space, the fitting hole, a lock bar which is held in the holding hole such that the lock bar is movable in the holding hole in an axial direction of the holding hole parallel to an axis line thereof, and which is movable to an operative position thereof in which the lock bar is engaged with the engaging recess of the fitting shank to prevent the fitting shank from moving away from the fitting hole, and to a retracted position thereof in which the lock bar is disengaged from the engaging recess to allow the fitting shank from moving away from the fitting hole, an elastic member which biases the lock bar to the operative position thereof, and an operating member which moves, based on the special movement of the at least one of the two moving members, the lock bar to the retracted position thereof against an elastic force of the elastic member.

According to this feature, the lock device can be produced at low cost. In addition, since the elastic force of the elastic member biases the lock bar to its operative position, the locked state can be maintained with high reliability.

(15) According to a fifteenth feature of the present invention that includes the fourteenth feature (14), the operating member of the lock device of the each one of the two attaching devices moves, based on a special approaching movement of the at least one of the two moving members toward the other moving member over a lower limit of the predetermined range of distance therebetween, the lock bar to the retracted position thereof against the elastic force of the elastic member.

(16) According to a sixteenth feature of the present invention that includes the fifteenth feature (15), the operating member of the lock device of the each one of the two attaching devices comprises an integral portion of the other of the two moving members than the one moving member holding the lock bar moved by the operating member.

When the two moving members are specially moved toward each other over the lower limit of the predetermined range of distance therebetween, the lock bar held by one of the two moving members is moved to its retracted position by the operating member integral with the other moving member, and simultaneously the lock bar held by the other moving member is moved to its retracted position by the operating member integral with the one moving member. Thus, the lock bars can be moved to their retracted positions, simply and easily.

BRIEF DESCRIPTION OF THE DRAWINGS

The above and other objects, features, advantages and technical and industrial significance of the present invention will be better understood by reading the following detailed description of preferred embodiments of the invention, when considered in connection with the accompanying drawings, in which.

DETAILED DESCRIPTION OF THE PREFERRED EMBODIMENTS

Figure 1:
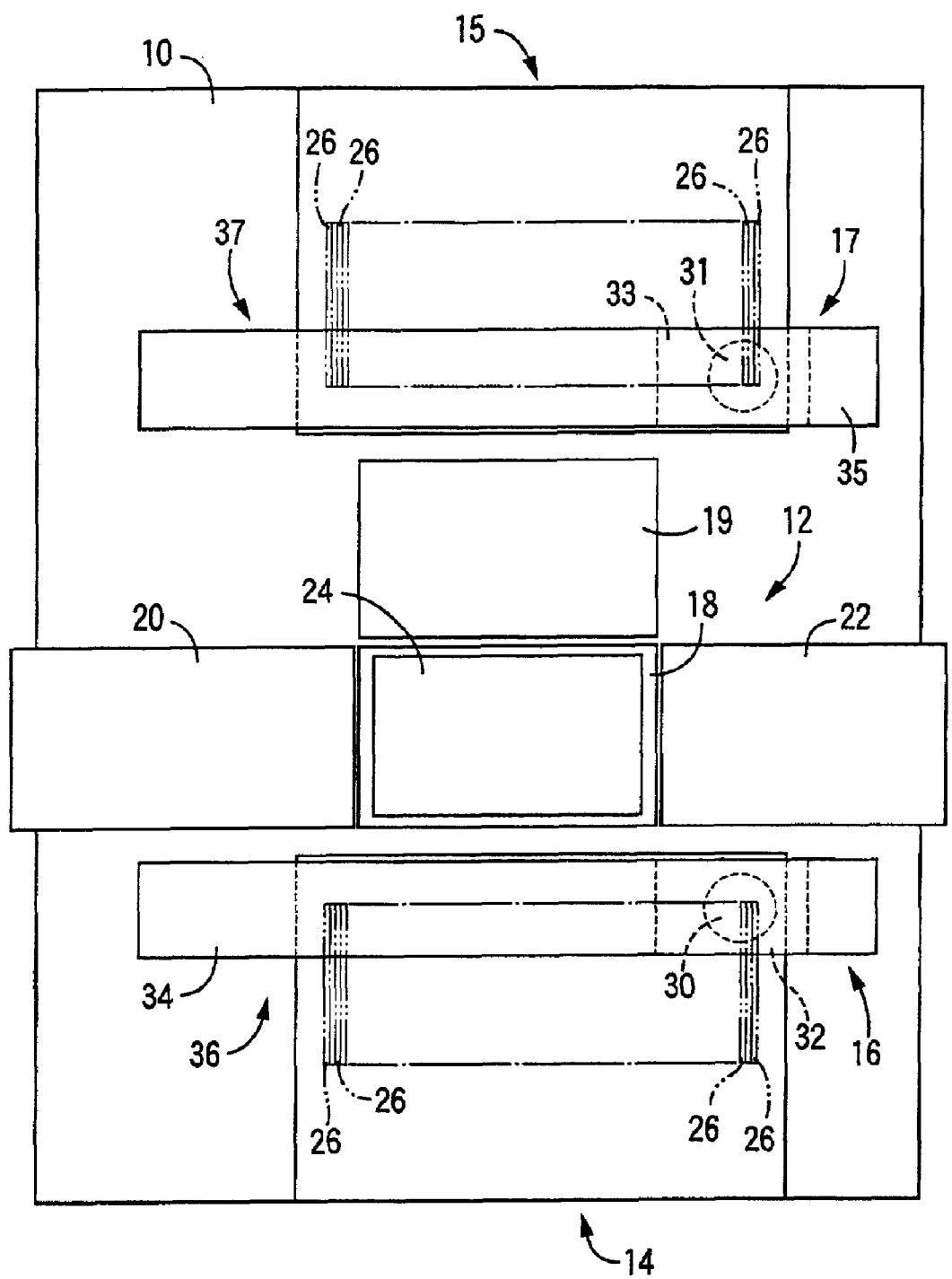
FIG. 1 is a schematic plan view of an electric-component (EC) mounting system including an EC transferring and mounting device including an EC holding apparatus to which the present invention is applied.

Hereinafter, there will be described in detail an electronic-component (EC) mounting system including an EC holding apparatus to which the present invention is applied, by reference to the drawings. As shown in FIG. 1, the present EC mounting system includes a machine base 10 on which a printed-wiring-board (PWB) conveying device 12, two EC supplying devices 14, 15, and two EC transferring and mounting devices 16, 17. The PWV conveying device 12 will be described below briefly since it is not relevant to the present invention. The PWB conveying device 12 includes two main conveyors 18, 19, a carry-in conveyor 20, and a carry-out conveyor 22. Each of the two main conveyors 18, 19 includes a PWB positioning and supporting device which positions and supports a printed-wiring board (PWB) 24 as a circuit substrate, and extends in a PWB-convey direction in which the each main conveyor conveys the PWB 24 (i.e., a left-right direction as seen in FIG. 1; this direction will be referred to as the X-axis direction, if appropriate). The two main conveyors 18, 19 are juxtaposed in a direction (this direction will be referred to as the Y-axis direction, if appropriate) that is perpendicular to the PWB-convey direction, i.e., the X-axis direction in a horizontal plane. The carry-in conveyor 20 carries in a PWB 24 to each of the two main conveyors 18, 19, and the carry-out conveyor 22 carries out, from the each main conveyor, a printed circuit board (PCB) as an electric circuit on which electronic components (EC) have been mounted.

Each of the EC supplying devices 14, 15 includes a feeder-support table and a plurality of EC feeders 26 each of which is detachably attached to the feeder-support table. More specifically described, the EC feeders 26 are attached to the feeder-support table such that respective EC-supply portions of the EC feeders 26, from which ECs are supplied, are arranged along a straight line parallel to the X-axis direction. The EC feeders 26 may comprise various sorts of feeders, such as a feeder which feeds an EC tape carrying a number of ECs at a regular interval of distance and thereby sends each EC to its EC-supply portion, or a feeder which stores a number of ECs in bulk in a casing, arranges the ECs into an array by utilizing vibration, inclination, air flow, or one or more conveying belts, or an appropriate combination thereof, and sends each EC to its EC-supply portion. The EC-supply portion of each EC feeder 26 may be said as an EC-take portion from which a corresponding one of the two EC transferring and mounting devices 16, 17 takes the ECs.

Each of the two EC transferring and conveying devices 16, 17 takes ECs 28 from a corresponding one of the two EC supplying devices 14, 15, transfers the ECs 28, and mounts the ECs 28 on a PWB 24 positioned and supported by each of the two main conveyors 18, 19. The two EC transferring and conveying devices 16, 17 include respective mounting heads 30, 31; and respective X-Y robots 36, 37 which include respective X-axis slides 32, 33 and respective Y-axis slides 34, 35 and move the respective mounting heads 30, 31 to respective arbitral positions in the horizontal plane. Since the two mounting heads 30, 31 have an identical structure and the two X-Y robots 36, 37 have an identical structure, there will be described the mounting head 30 and the X-Y robot 36 as respective representatives. The Y-axis slide 34 is provided on the machine base 10 such that the Y-axis slide 34 is movable in the Y-axis direction, and the X-axis slide 32 is provided on the Y-axis slide 34 such that the X-axis slide 32 is movable in the X-axis direction. The Y-axis slide 34 is moved in the Y-axis direction by a Y-axis-slide moving device including a servomotor 38 (FIG. 4) as a drive source and a motion converting device which converts rotation of the servomotor 38 into linear movement and transmits the linear movement to the Y-axis slide 34. Similarly, the X-axis slide 32 is moved in the X-axis direction by an X-axis-slide moving device including a servomotor 42 (FIG. 4) as a drive source and a motion converting device which converts rotation of the servomotor 42 into linear movement and transmits the linear movement to the X-axis slide 32.

Figure 2:
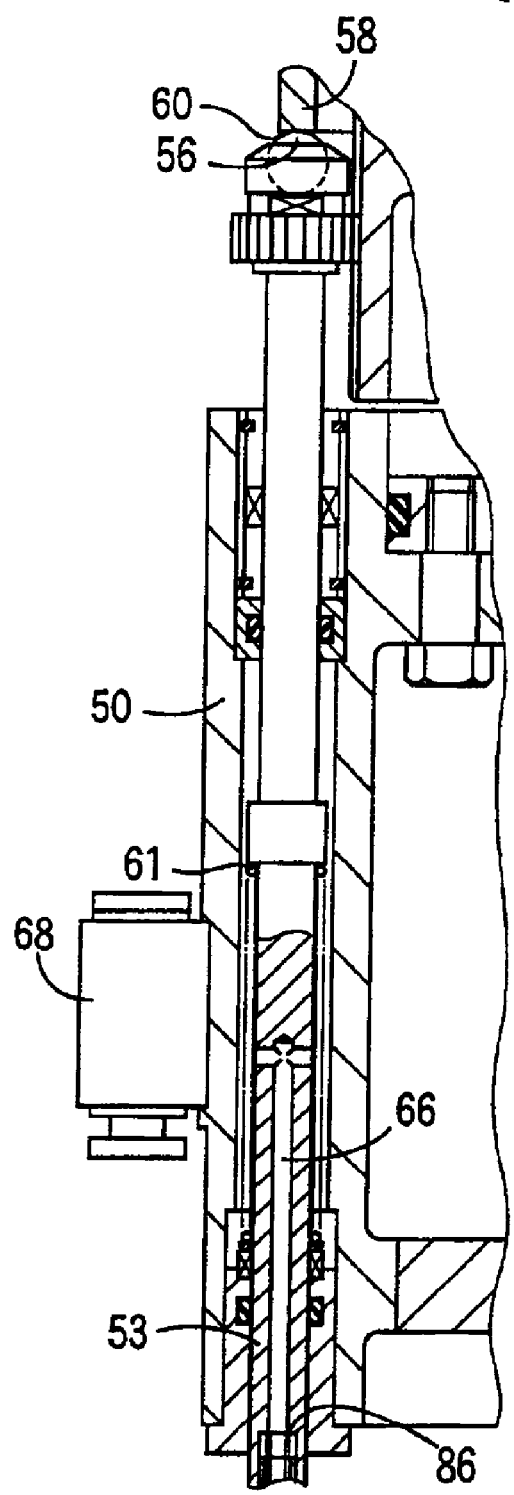
FIG. 2 is a cross-sectioned, front elevation view of a relevant portion of the EC transferring and mounting device.

As shown in FIG. 2, the mounting head 30 includes a rotatable body 50 which is supported by the X-axis slide 32 such that the rotatable body 50 is intermittently rotatable about a vertical axis line. The rotatable body 50 is rotated by an arbitrary angle in each of opposite directions by a rotating or driving device including a servomotor 52 as a drive source. Each of the servomotors 38, 42, 52 is an electric rotary motor as a sort of electric motor that is accurately controllable with respect to rotation angle and rotation speed. The servomotors may be replaced with stepper motors.

The rotatable body 50 supports a plurality of support shafts 53 such that the support shafts 53 are equiangularly spaced from each other about the axis line of the rotatable body 50. For example, twelve or sixteen support shafts 53 are supported by the rotatable body 50. A lower end portion of each of the support shafts 53 that projects downward from the rotatable body 50 supports a suction nozzle 54 (FIG. 3) which applies suction or negative pressure to an EC 28 and thereby holds the EC 28. Each support shaft 53 fits in the rotatable body 50 such that the support shaft 53 is movable in a direction parallel to the axis line of the rotatable body 50, and is rotatable about its own axis line. When the rotatable body 50 is rotated, the support shafts 53 are revolved about the axis line of the rotatable body 50. As the rotatable body 50 is intermittently rotated at a regular angular pitch equal to a regular angular pitch at which the support shafts 53 are equiangularly spaced from each other on the rotatable body 50, the support shafts 53 are sequentially stopped at a plurality of stop positions including an EC holding and mounting position and an image taking position. At the EC holding and mounting position, each of the support shafts 53 takes an EC 28 from the EC supplying device 14, and mounts the EC 28 on the PWB 24. Each support shaft 53 that is supported by the rotatable body 50 such that the each shaft 53 is movable in directions parallel to the axis line of the body 50, has a cam follower 56 which follows a cam surface 60 of a stationary cam 58 which is provided on the X-axis slide 32 that supports the rotatable body 50 such that the body 50 is rotatable. Each of the support shafts 53 is biased upward by a compression coil spring 61 as an elastic member as a sort of biasing device that is provided between the each support shaft 53 and the rotatable body 50, so that the cam follower 50 contacts the cam surface 60. The cam surface 60 has an annular shape whose center rides on the axis line of the rotatable body 50, and extends in a horizontal plane perpendicular to the axis line of each support shaft 53. In addition, the annular cam surface 60 includes a plurality of height-variable portions whose height varies or changes in a circumferential direction of the cam surface 60. Therefore, when the rotatable body 50 is rotated and each support shaft 53 is moved under each of the height-variable portions, the each support shaft 53 is moved in the directions parallel to the axis line of the body 50. The EC holding and mounting position corresponds to the lowest portion of the cam surface 60, and the image taking position corresponds to the highest portion of the same 60.

An elevating and lowering device 62 (FIG. 4) is provided at a position, on the X-axis slide 32, that corresponds to the EC holding and mounting position, and elevates and lowers each support shaft 53 being positioned at that position. The elevating and lowering device 62 may be one, disclosed in Japanese patent document No. 11-220294 or its corresponding U.S. patent application Ser. No. 09/234,489, that includes a drive motor as a drive source, such as a servomotor; and a movable member that is elevated and lowered by the drive motor and is engageable with the cam follower 56 of each support shaft 53. The movable member is moved between an uppermost position where a lower surface of a drive portion of the movable member is continuous with the cam surface 60 of the stationary cam 58, and a lowermost position lower than the cam surface 60. When each support shaft 53 is moved to the EC holding and mounting position owing to the rotation of the rotatable body 50 and the cam follower 56 of the each support shaft 53 is engaged with the lower surface of the drive portion of the movable member, the movable member is moved downward, so that the support shaft 53 supporting the suction nozzle 54 is moved downward. When the movable member is moved upward, the support shaft 53 is also moved upward owing to the biasing force of the compression coil spring 61. Alternatively, the support shafts 53 may be associated with respective elevating and lowering devices each of which may be one, disclosed in Japanese patent document No. 11-214897 or its corresponding U.S. Pat. No. 6,276,051, that includes a pressurized-fluid-actuated cylinder device. In addition, the X-axis slide 32 is provided with a rotating device which rotates each support shaft 53 about its own axis line to correct an angular-positional error of the EC 28 held by the suction nozzle 54 and/or change a current angular position of the EC 28 to another angular position. However, the rotating device is not described here in detail since it is not relevant to the present invention.

The suction nozzle 54 that applies negative pressure to the EC 28 and thereby holds the EC 28 is connected to a passage 66 formed in the support shaft 53 and a pressure switch valve 68 provided on the rotatable body 50. The pressure switch valve 68 is connected to a negative-pressure supply device, not shown, via a passage, not shown, that is provided in the rotatable body 50. The pressure switch valve 68 is selectively placed by a control device 220 (FIG. 4) in its pressure-supply position in which the switch valve 68 allows negative pressure to be supplied or applied from the negative-pressure supply device to an inner passage of the suction nozzle 54 so that the suction nozzle 54 can hold, at its suction surface 70, the EC 28; and in an EC-release position in which the switch valve 68 allows positive pressure higher than atmospheric pressure to be supplied or applied from a positive-pressure supply device, not shown, to the inner passage of the suction nozzle 54 so that the suction nozzle 54 releases the EC 28 off the suction surface 70. Even when the rotatable body 50 is rotated, the passages provided in the body 50 are kept communicated with the negative-pressure supply device via passages provided in the X-axis slide 32.

Figure 3:
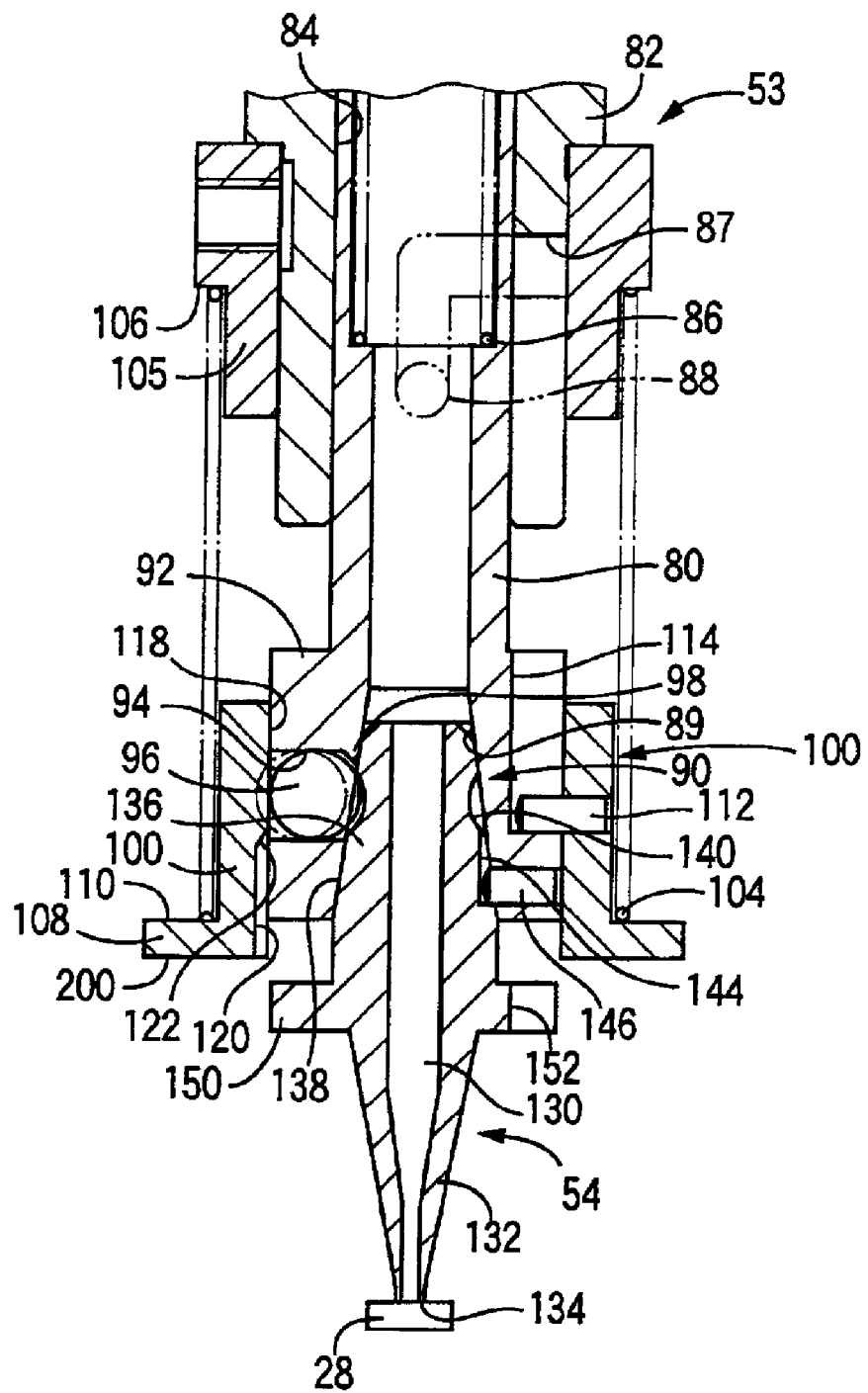
FIG. 3 is a cross-sectioned, front elevation view of the EC holding apparatus of the EC transferring and mounting device.

As shown in FIG. 3, the suction nozzle 54 is attached to the support shaft 53 via an adaptor 80. The adaptor 80 fits in a receiving hole 84 formed in a nozzle holding portion 82 of the lower end portion of the support shaft 53, such that the adaptor 82 is movable relative to the nozzle holding portion 82 in an axial direction of the adaptor 80. The adaptor 80 is biased by a compression coil spring 86 as an elastic member as a sort of biasing device, in a downward direction in which the adaptor 80 projects from the nozzle holding portion 82. The nozzle holding portion 82 has a generally inverted-J-shaped groove 87 which extends upward from a lower end surface of the holding portion 82, then extends in a circumferential direction of the holding portion 82, and finally extends downward by a certain distance. Meanwhile, the adaptor 80 has an integrally formed, engaging pin 88 that projects radially outwardly from an outer circumferential surface thereof. When the adaptor 80 is attached to the support shaft 53, first, the engaging pin 88 is inserted through the lower open end of the inverted-J-shaped groove 87, subsequently is moved upward, then is rotated by a certain angle, and finally is biased downward by the coil spring 86 so that the pin 88 engages an end wall of the groove 87. Thus, a limit of projection of the adaptor 80 from the nozzle holding portion 82 is defined, and rotation of the adaptor 80 relative to the holding portion 82 is prevented.

A lower or free end portion of the adaptor 80 that projects downward from the nozzle holding portion 82 provides a generally cylindrical portion 92 having an inner tapered hole 90 that opens in a lower end surface of the cylindrical portion 92. A diameter of an inner circumferential surface 89 of the tapered hole 90 increases in a direction toward the lower end surface of the cylindrical portion 92. The cylindrical portion 92 has three radial through-holes 94 (only one 94 is shown in FIG. 3) that take a same position in the axial direction of the adaptor 80 and are equiangularly spaced from each other about a central axis line of the same 80. Each of the three through-holes 94 holds a ball 96 such that the ball 96 is movable in an axial direction of the each hole 94 and is generally immovable in a radial direction thereof. The ball 96 has a diameter somewhat greater than a length of the through-hole 94 as measured in its axial direction. A projecting portion 98 projects radially inwardly from a portion of an inner open end of the through-hole 94, and prevents the ball 96 from coming off the inner open end of the through-hole 94.

A generally cylindrical sleeve 100 fits on an outer circumferential surface of the cylindrical portion 92 of the adaptor 80, such that the sleeve 100 is slideable on the cylindrical portion 92 in the axial direction of the adaptor 80. The sleeve 100 is biased downward by a compression coil spring 104 as an elastic member as a sort of biasing device. The coil spring 104 rests, at its one end, on a lower surface 106 of a spring rest 105 fixed to the support shaft 53, and rests, at its other end, on an upper surface 110 of a flange-like operable portion 108 which is an integral portion of the sleeve 100 and projects outward from a remaining portion of the same 100. An engaging pin 112 is fixed to the sleeve 100, such that the pin 112 projects radially inwardly from the sleeve 100 and engages an axial groove 114 formed in the outer circumferential surface of the cylindrical portion 92 of the adaptor 80. The axial groove 114 extends, at a position where the through-holes 94 are not provided, in an axially downward direction from an upper end surface of the cylindrical portion 92, and has a blind lower end. Owing to the engagement of the engaging pin 112 and the axial groove 114, the sleeve 80 is attached to the adaptor 80 such that the sleeve 100 is not rotatable relative to the adaptor 80 and is movable relative to the same 80 in the axial direction thereof. Since the engaging pin 112 engages the lower end of the axial groove 114, a limit of the downward movement of the sleeve 100 relative to the adaptor 80 is defined. Thus, the engaging pin 112 as a n engaging portion and the axial groove 114 as an engaged portion cooperate with each other to function as not only a relative-rotation preventing device but also a stopper device which defines a limit of movement of the sleeve 100 caused by the biasing force of the coil spring 104.

The sleeve 100 has an inner circumferential surface 118 having a diameter somewhat greater than a diameter of the outer circumferential surface of the cylindrical portion 92 of the adaptor 80, and the inner surface 118 has, in its lower half portion located on the side of the operable portion 108, three radial recesses 120 that are equiangularly spaced from one another about a central axis line of the sleeve 100 and correspond to the three though-holes 94 holding the respective balls 96. An upper end portion of each axial recess 120 provides a guide surface 122 whose depth continuously decreases as seen in an upward direction. In a state in which the sleeve 100 is held at its operative position in which an upper half portion of the inner surface 118 thereof covers respective outer open ends of the through-holes 94, the inner surface 118 limits the movement of each of the balls 96, so that the sleeve 100 prevents the each ball 96 from coming off the outer open end of the corresponding through-hole 94, and causes the each ball 96 to project inward from the inner open end of the same 94. Meanwhile, in a state in which the sleeve 100 is held at its retracted position in which the three axial recesses 120 thereof face the respective outer open ends of the three through-holes 94, each of the balls 96 is allowed to be moved by a certain distance in a radially outward direction into the corresponding axial recess 120. In the latter state, a limit of the radially outward movement of the each ball 96 is defined by abutment of the each ball 96 on a bottom surface of the corresponding axial recess 120. Normally, the sleeve 100 is held at its operative position owing to the biasing force of the coil spring 104.

The suction nozzle 54 that applies the negative pressure to the EC 28 and thereby holds the same 28 has an inner passage 130 whose one end is connected to the negative-pressure supply device via the passage 60 and whose other end opens in a suction surface 134 of a suction portion 132 of the nozzle 54. The suction nozzle 54 includes, in addition to the suction portion 132, a fitting portion 136 as a tapered axial portion having a tapered outer circumferential surface 138 whose diameter increases as seen in a direction toward the suction portion 132. The fitting portion 136 fits in the tapered hole 90 of the adaptor 80 such that the tapered outer surface 138 of the fitting portion 136 engages the tapered inner surface 89 of the adaptor 80. The tapered outer surface 138 has, in an intermediate portion thereof as seen in an axial direction of the suction nozzle 54, an annular groove 140 formed in a circumferential direction of the nozzle 54.

When the suction nozzle 54 is attached to the adaptor 80, first, the sleeve 100 is moved to its retracted position and, in this state, the tapered, fitting portion 136 is fitted in the tapered hole 90. Subsequently, the sleeve 100 is moved to its operative position, so that the three balls 96 are pushed inward by the guide surface 122 of the sleeve 100 and partly project out of the respective inner open ends of the through-holes 94 into the tapered hole 90. Thus, the balls 96 engage the annular groove 140 of the fitting portion 13 of the suction nozzle 54, and thereby hold the nozzle 54. The adaptor 80 has the through-holes 94 at such positions which assure that in a state in which the fitting portion 136 fits in the tapered hole 90, a widthwise center of the annular groove 140 having the arcuate cross section is somewhat lower than the respective centers of the balls 96. Therefore, the balls 96 engage an upper end portion of the annular groove 140, and thereby draw the fitting portion 136 into the tapered hole 90. The inner surface 118 of the sleeve 100 prevents the balls 96 from being moved radially outwardly. Thus, the suction nozzle 54 is locked to the adaptor 80, such that even if a force is exerted to the nozzle 54 in a direction to remove the nozzle 54 from the adaptor 80, the force is not exerted to the balls 96 in a direction to increase the amount of elastic deformation of the compression coil spring 104.

If the sleeve 100 is moved from its operative position to its retracted position against the biasing force of the coil spring 104, the three axial recesses 120 of the sleeve 100 face the three balls 96, respectively, so that the balls 96 are allowed to disengage from the annular groove 140 of the suction nozzle 54. Thus, the balls 96 are unlocked from its locked state in which the balls 96 are engaged with the annular groove 140. In this state, if a force is applied to the nozzle 54 in a direction to remove the nozzle 54 from the adaptor 80, the nozzle 54 can be removed from the adaptor 80.

The suction nozzle 54 has an axial groove 144 at a position between the annular groove 140 formed in the tapered outer surface 138 of the fitting portion 136, and the suction portion 132. The adaptor 80 has, at a position, as seen in the circumferential direction of the cylindrical portion 92, that corresponds to the axial groove 144, an engaging pin 146 which is fixed to the cylindrical portion 92 such that the pin 146 projects radially inward. A free end portion of the engaging pin 146 engages the axial groove 144, such that the pin 146 allows a movement of the suction nozzle 54 relative thereto in the axial direction of the adaptor 80 and does not allow a movement of the nozzle 54 relative thereto in a direction perpendicular to the axial direction. Thus, the nozzle 54 and the adaptor 80 are prevented from being rotated relative to each other. The axial groove 144 and the engaging pin 146 cooperate with each other to provide a relative-rotation preventing device. The suction nozzle 54 additionally includes, at a position between the fitting portion 136 and the suction portion 132, a background forming portion 150 which projects radially outward. A lower surface of the background forming portion 150 that is located on the side of the suction portion 132 may be used as a reflecting surface that reflects light, a fluorescent surface that absorbs ultraviolet rays and emits visible rays, or a dark surface such as a black surface. In each case, the tapered, outer circumferential surface of the suction portion 132 is used as the same sort of surface as that of the lower surface of the background forming portion 150, so that when an image of the EC 28 held by the suction portion 132, the outer surface of the suction portion 132 cooperates with the lower surface of the background forming device 150 to provide a light or dark background of the image. In the present embodiment, the background forming portion 150 has, in a portion thereof as seen in a circumferential direction thereof, a radial recess 152.

At a nozzle exchanging position in the present EC mounting system, there is provided a suction-nozzle exchanging device 160 as a component-holder exchanging device, as shown in FIGS. 5, 6, 7, and 8. The suction-nozzle exchanging device 160 may be one which has a construction similar to that of a suction-nozzle exchanging device disclosed in the previously-indicated Japanese patent document No. 11-220294 or its corresponding U.S. patent application Ser. No. 09/234,489, and will be described below briefly. The suction-nozzle exchanging device 160 includes a nozzle accommodating member 162 as a component-holder accommodating member, and a removal preventing plate 164 as a removal preventing member. The nozzle accommodating member 162 accommodates a plurality of sorts of suction nozzles 54, though not shown. The nozzle accommodating member 162 has a generally plate-like, rectangular shape, and has a plurality of nozzle receiving holes 166. Each of the nozzle receiving holes 166 is a stepped hole in which one suction nozzle 54 fits. Each nozzle receiving hole 166 includes a small-diameter portion 168 whose diameter assures that the each hole 166 can receive the suction portion 132 having the greatest diameter in all the sorts of suction nozzles 54; and a great-diameter portion 170 whose diameter is somewhat greater than that of the background forming portion 150. Each nozzle receiving hole 168 has, at a position between the small-diameter and great-diameter portions 168, 170, a shoulder surface 171 from which a rotation preventing pin 172 as a rotation preventing member projects upward. A length of upward projection of the pin 172 from the shoulder surface 171 is somewhat smaller than a depth of the great-diameter portion 170.

The removal preventing plate 164 has a plate-like rectangular shape which can cover the nozzle accommodating member 162. More specifically described, the removal preventing plate 164 has a plurality of circular holes 174 and a plurality of connecting holes 176 connecting the circular holes 174 to one another in a lengthwise direction of the plate 164. Each of the circular holes 174 has a diameter which is somewhat greater than that of the great-diameter portion 170 of each nozzle receiving hole 166. The removal preventing plate 164 has, in its lengthwise and widthwise directions, the circular holes 174 at the same pitches as those at which the nozzle accommodating member 162 has the nozzle receiving holes 166 in its lengthwise and widthwise directions. Each of the connecting holes 176 has a width smaller than the diameter of the background forming portion 150 of each suction nozzle 54. The width of each connecting hole 176 is defined as a dimension thereof as measured in the widthwise direction of the removal preventing plate 164 in a plane parallel to the plate 164. Each connecting hole 176 is defined by a pair of projecting portions of the removal preventing plate 164 that are opposed to, and distant from, each other in the widthwise direction of the plate 164, and the pair of projecting portions function as a pair of removal preventing portions 178.

Figure 8:
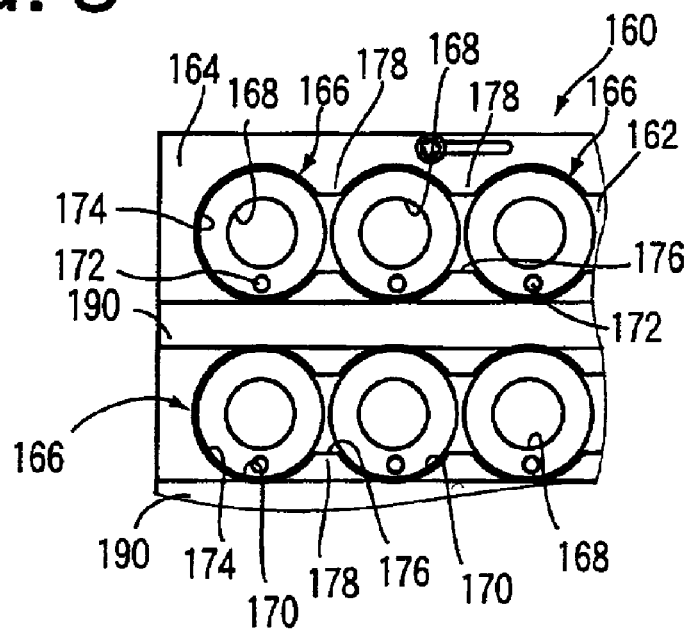
FIG. 8 is a plan view showing a state in which the removal preventing plate of the nozzle exchanging device is held at its retracted position.

The removal preventing plate 164 is moved by a removal-preventing-plate moving device 180 (FIG. 4), relative to the nozzle accommodating member 162, in the lengthwise direction thereof, to its operative position (shown in FIG. 7) and its retracted position (shown in FIG. 8). In a state in which the plate 164 is held at its operative position, the pairs of removal preventing portions 178 thereof are located right above the nozzle receiving holes 166, and thereby prevent the suction nozzles 54 from being removed from, or coming off, the nozzle accommodating member 162. In a state in which the plate 164 is held at its retracted position, the circular holes 174 are located right above the nozzle receiving holes 166, and thereby allow the nozzles 54 to be removed from the accommodating member 162. The removal-preventing-plate moving device 180 may be one which includes a pressurized-air-operated cylinder device as a sort of pressurized-fluid-operated actuator, or one which includes an electric motor.

A plurality of drive members 190 are provided above the removal preventing plate 164. Each of the drive members 190 has a plate-like elongate shape extending in the lengthwise direction of the nozzle accommodating member 162, and is provided between a pair of adjacent arrays of nozzle receiving holes 166 extending in the lengthwise direction of the member 162. Thus, the drive members 190 are equidistantly spaced from each other in the widthwise direction of the member 162. Each drive member 190 includes a fitting portion 191 having a generally inverted-T-shaped transverse cross section, and is positioned relative to the nozzle accommodating member 162 in the widthwise direction thereof, such that the fitting portion 191 is fitted in an elongate groove 192 formed in the member 162 and is fastened and fixed to the member 162 with a plurality of screws 193. A distance or spacing between each pair of adjacent drive members 190, as seen in the widthwise direction of the nozzle accommodating member 162, is substantially equal to, or somewhat greater than, the diameter of the circular holes 174 of the removal preventing plate 164. This plate 164 has a plurality of elongate grooves 194 each of which extends in the lengthwise direction and has a width greater than a width of a leg portion of the T-shaped cross section of the fitting portion 191 of each drive member 190. The width of the leg portion of the fitting portion 191 is defined as a dimension thereof as measured in a direction perpendicular to the lengthwise direction of each drive member 190. The elongate grooves 194 allow the removal preventing plate 164 to be moved relative to the nozzle accommodating member 162. Thus, the removal preventing plate 164 is moved in a space which is defined by the nozzle accommodating member 162 and the drive members 190. An upper surface of each of the drive members 190 provides a flat, engaging surface 198. Meanwhile, a lower surface of the operable portion 108 of the sleeve 100 provides a flat, engaging surface 200 which can engage the engaging surface 198 of each drive member 190.

Figure 4:
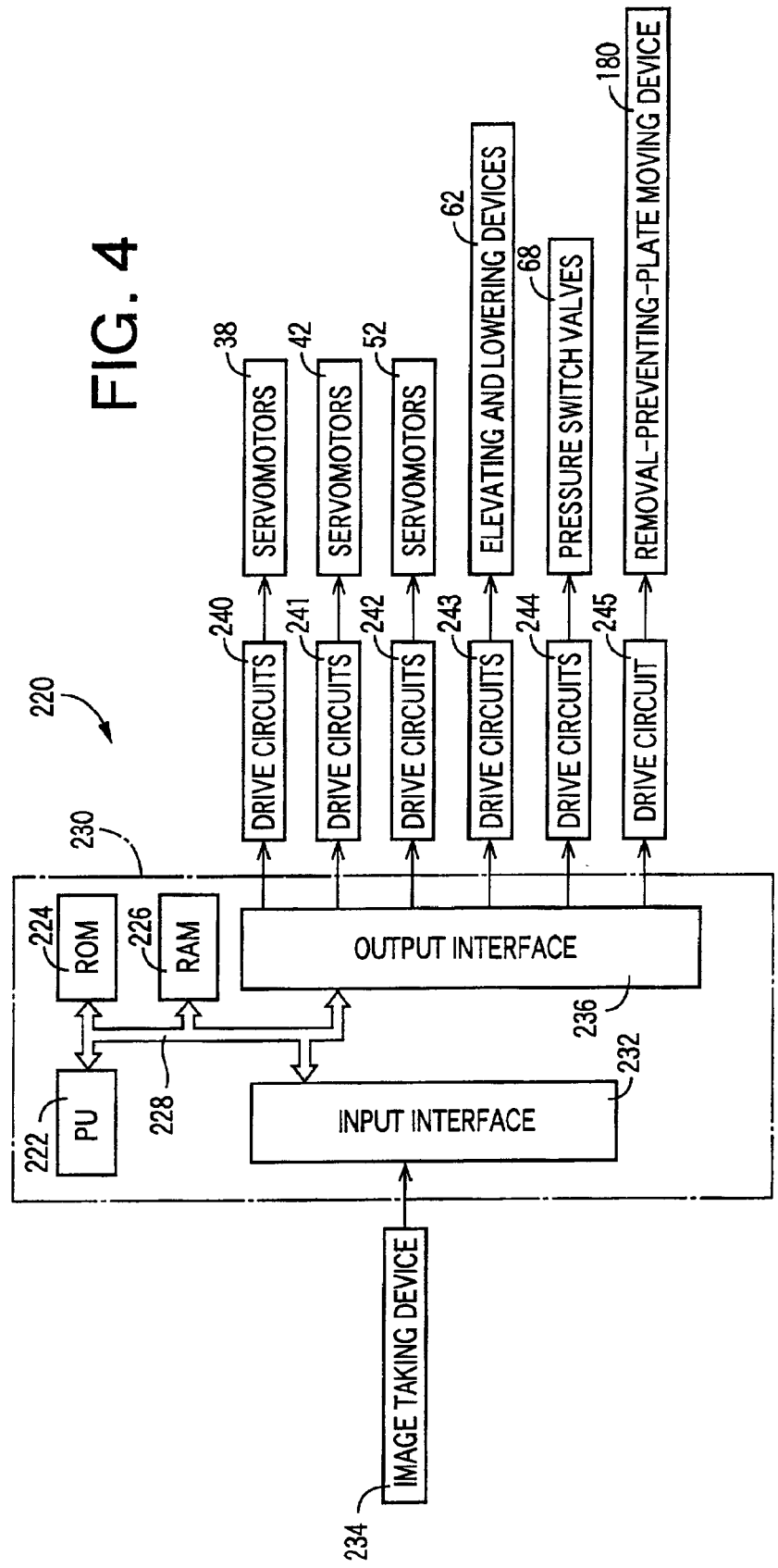
FIG. 4 is a diagrammatic view of a relevant portion of a control device of the EC mounting system.

The PWB conveying device 12, the EC supplying devices 14, 15, the EC transferring and mounting devices 16, 17, etc. are controlled by the control device 220 shown in FIG. 4. The control device 220 is essentially provided by a computer 230 including a processing unit (PU) 222, a read only memory (ROM) 224, a random access memory (RAM) 226, and a bus 228 for connecting those elements 222, 224, 226 to one another. An input interface 232 is connected to the bus 228, and an image taking device 234 is connected to the input interface 232. The image taking device 234 takes an image of the EC 28 held by each of the mounting heads 30, 31. The bus 228 is connected to an output interface 236 which, in turn, is connected via respective drive circuits 240, 241, 242, 243, 244, 245 to the servomotors 38, 42, 52, the elevating and lowering devices 62, the pressure switch valves 68, the removal-preventing-plate moving device 180, etc.

Next, the operation of the present EC mounting system will be described. The two EC transferring and mounting devices 16, 17 alternately mount the ECs 28 on the PWB 24 positioned and supported by each one of the main conveyors 18, 19. While the two mounting devices 16, 17 mounts the ECs 28 on the PWB 24 positioned and supported by one of the two main conveyors 18, 19, the PWB 24 on which the EC 28 have been mounted is carried from the other main conveyor and another PWB 24 is carried in, and is positioned and supported by the other main conveyor, so that the new PWB 24 is ready, on the other main conveyor, for mounting of ECs 28. The EC transferring and mounting device 16 takes ECs 28 from the EC supplying device 14 only, and the EC transferring and mounting device 17 takes ECs 28 from the EC supplying device 15 only. Hereinafter, there will be described the EC taking and mounting actions of the EC transferring and mounting device 16 as a representative of the two devices 16, 17.

When the EC transferring and mounting device 16 takes ECs 28 from the EC supplying device 14, the rotatable body 50 is moved by the X-Y robot 36 to a position right above the EC-supply portion of the EC feeder 26 to supply the ECs 28, and is intermittently rotated so that the support shafts 53 are sequentially positioned at the EC holding and mounting position. When each of the support shafts 53 reaches the EC holding and mounting position, the drive source of the elevating and lowering device 62 is started to lower the movable member of the device 62 and thereby lower the each support shaft 53. After the suction nozzle 54 supported by the support shaft 53 contacts an EC 28 and holds, by suction, an upper surface of the EC 28, the movable member of the elevating and lowering device 62 is elevated to elevate the support shaft 53 against the biasing force of the compression coil spring 61, so that the suction nozzle 54 takes the EC 28 out of the EC feeder 26. After the suction nozzle 54 takes the EC 28, the image taking device 234 takes an image of the EC 28 held by the nozzle 54, and the computer 230 determines, based on the image taken by the image taking device 234, positional errors of the EC 28 held by the nozzle 54. The suction nozzle 54 transfers the EC 28 to a prescribed EC mounting place on the PWB 24 positioned and supported by one of the main conveyors 18, 19, while the positional errors of the EC 28 are corrected. Thus, the EC 28 is accurately mounted on the PWB 24.

When each support shaft 53 holds or mounts the EC 28, the support shaft 53 may be moved upward at a high acceleration, or may be stopped at a high deceleration, so that a great force may be exerted to the suction nozzle 54 in a direction to remove the nozzle 54 from the adaptor 89. In those cases, however, the balls 96 that are engaged with the annular groove 140 are prevented from being moved radially outward, by the inner surface 118 of the sleeve 100. That is, the force exerted in the direction to remove the nozzle 54 is not exerted to the sleeve 100 in a direction to increase the amount of elastic deformation of the compression coil spring 104, and the locked state of the nozzle 54 is advantageously maintained. Thus, the nozzle 54 is effectively prevented from coming off the adaptor 80.

Figure 5:
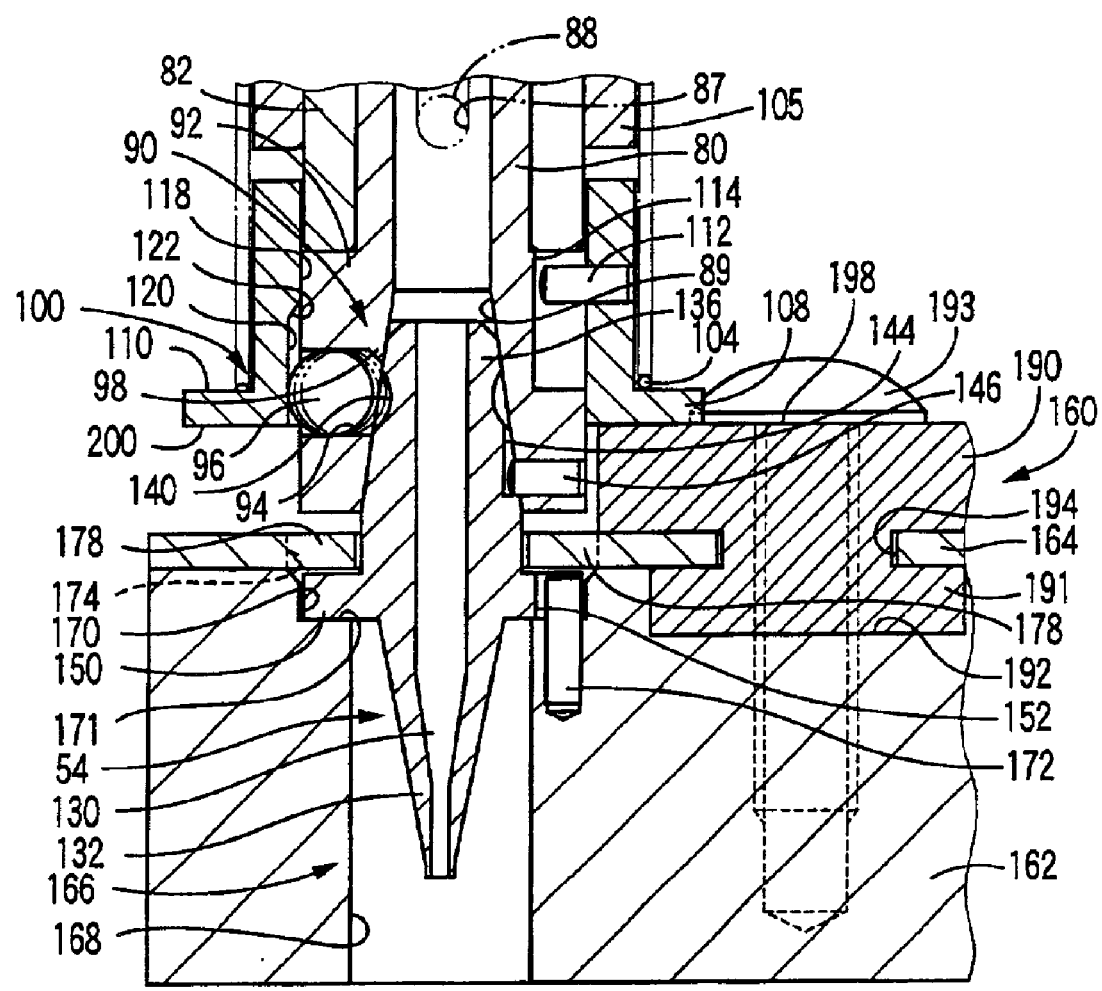
FIG. 5 is a cross-sectioned, front elevation view showing a state in which a ball as a lock member is moved to its retracted position so as to allow a suction nozzle as part of the EC holding apparatus to be exchanged with another suction nozzle.

When it is needed to exchange the current suction nozzle 54 with another suction nozzle, because the current nozzle 54 is worn out or the current sort of ECs 28 are changed to a new sort of ECs, the mounting head 30 is moved to the nozzle exchanging position. More specifically described, the support shaft 53 supporting the suction nozzle 54 is moved to a position right above one vacant nozzle receiving hole 166 to which the nozzle 54 is to be returned, and subsequently is lowered so that the engaging surface 200 of the operable portion 108 of the sleeve 100 starts engaging the engaging surface 198 of one drive member 190, as illustrated in FIG. 5. When the support shaft 53 is further lowered from that position shown in FIG. 5, the suction nozzle 54 is lowered relative to the sleeve 100 that cannot be lowered any longer, while the compression coil spring 104 is compressed. That is, the sleeve 100 is moved from its operative position to its retracted position against the biasing force of the coil spring 104. Thus, the axial recesses 120 of the sleeve 100 face the balls 96, thereby allowing the balls 96 to be disengaged from the annular groove 140 of the nozzle 54.

Meanwhile, the suction nozzle 54 starts fitting in the small-diameter portion 168 of the nozzle receiving hole 166.

At that time, the removal preventing plate 164 remains at its operative position and the background forming portion 150 of the nozzle 54 is positioned a small distance above the plate 164. After the suction portion 132 fits in the small-diameter portion 168, the removal preventing plate 164 is moved by the removal-preventing-plate moving device 180 to its retracted position, and subsequently the background forming portion 150 fits in the great-diameter portion 170. In the state in which the background forming portion 150 has been brought into butting contact with the shoulder surface 171 of the nozzle receiving hole 166 and accordingly the fitting of the suction portion 132 in the small-diameter portion 168 has stopped and in which the radial recess 152 of the background forming portion 150 is engaged with the rotation preventing pin 172 and accordingly the rotation of the nozzle 54 is prevented, the removal preventing plate 164 is moved to its operative position by the removal-preventing-plate moving device 180, as shown in FIG. 5. Then, the support shaft 53 is elevated to a position where the balls 96 of the adaptor 80 can be disengaged from the annular groove 140 of the nozzle 54. Since the removal preventing portions 178 of the removal preventing plate 164 engage the background forming portion 150 of the nozzle 54, the nozzle 54 is pulled in a downward direction away from the adaptor 80. Thus, even if the balls 96 may be engaged with the annular groove 140 as indicated at two-dot chain line in FIG. 5, the balls 96 are caused to be moved radially outward to fit into the axial grooves 120, so that the nozzle 54 is allowed to remove from the adaptor 80.

Figure 6:
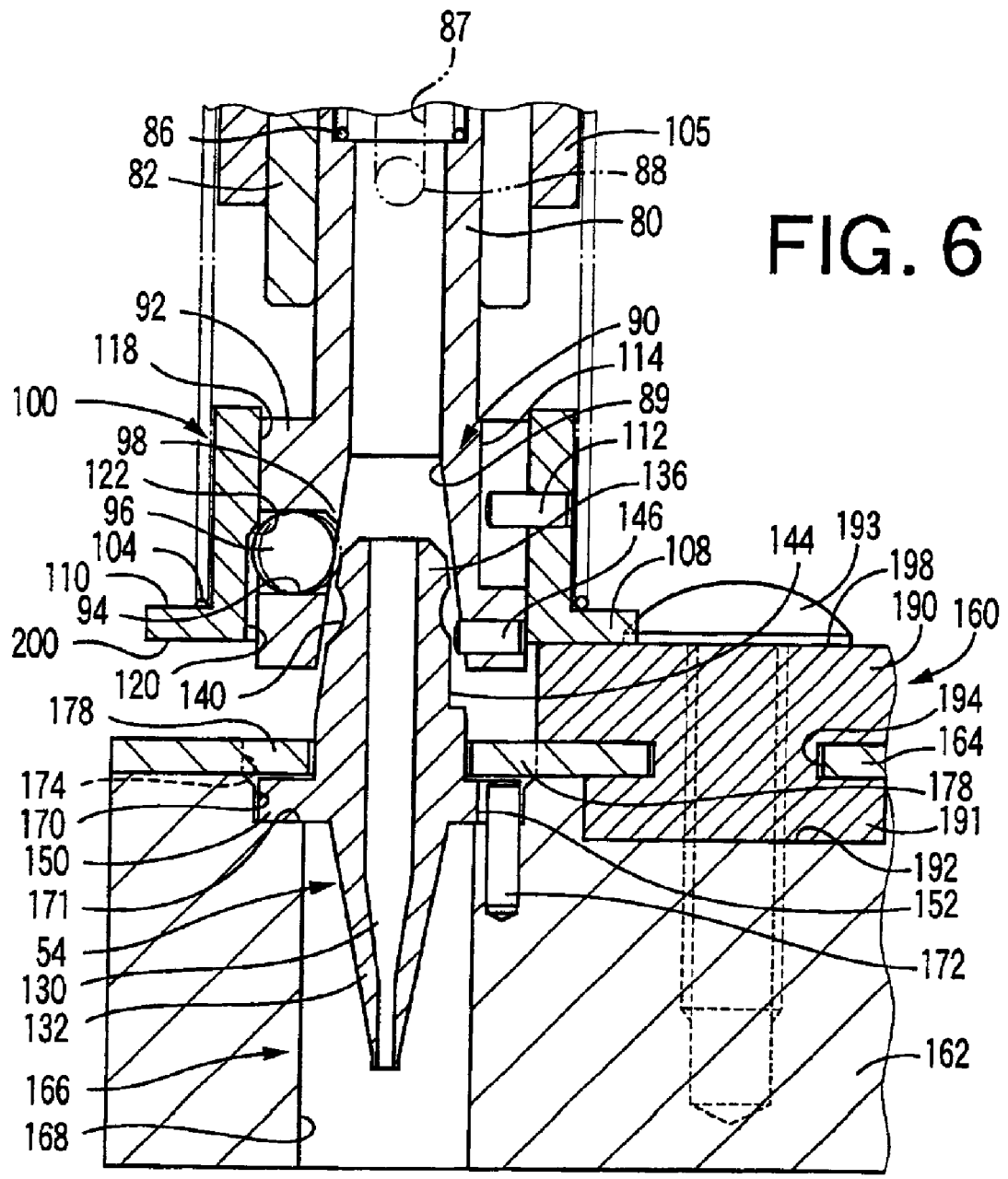
FIG. 6 is a cross-sectioned, front elevation view showing a state in which the suction nozzle is removed from an adaptor as another part of the EC holding apparatus.
Figure 7:
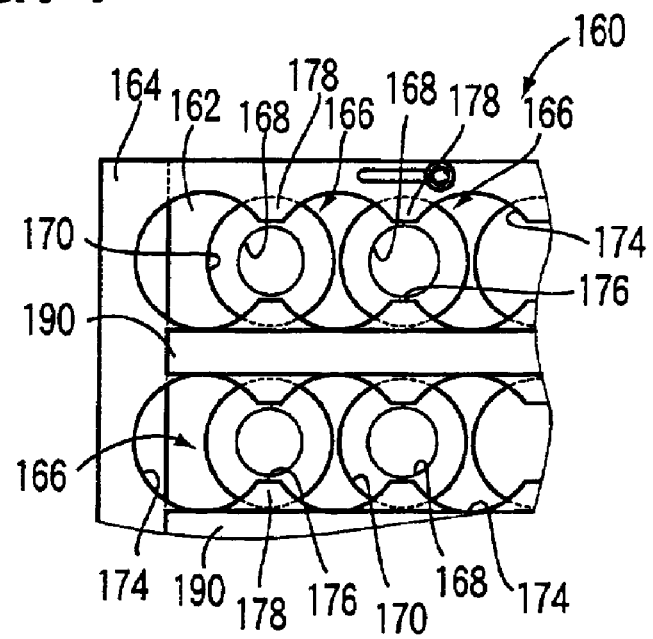
FIG. 7 is a plan view showing a state in which a removal preventing plate of a nozzle exchanging device is held at its operative position.

When a different sort of suction nozzle 54 or a new suction nozzle 54 of a same sort is attached to the adaptor 80, the support shaft 53 is moved to a position right above the suction nozzle 54, and subsequently is lowered toward the nozzle 54, in the same way as that in which a suction nozzle 54 is removed from the adaptor 80. Thus, as shown in FIG. 6, the operable portion 108 of the sleeve 100 engages the engaging surface 198 of one drive member 190, so that the sleeve 100 is moved to its retracted position to unlock the balls 96 from their locked state. In this state, the fitting portion 136 of the suction nozzle 54 is fitted in the tapered hole 90. Even if the balls 96 may partly project radially inward from the inner open ends of the through-holes 94, as indicated at two-dot chain line in FIG. 6, the balls 96 are pushed radially outward, and are fitted into the axial recesses 120, by the tapered outer surface 138 of the fitting portion 136, when the fitting portion 136 is fitted in the tapered hole 90. Thus, the fitting portion 136 of the nozzle 54 can be safely fitted in the tapered hole 90 of the adaptor 80. In addition, since the adaptor 80 is biased by the compression coil spring 86 toward the suction nozzle 54, the tapered outer surface 138 of the fitting portion 136 is tightly fitted in the tapered inner surface 89 of the tapered hole 90. Then, if the adaptor 80 is elevated and the operable portion 108 of the sleeve 100 is moved away from the drive member 190, the sleeve 100 is moved again to its operative position owing to the biasing force of the compression coil spring 104, and the balls 96 are pushed radially inward by the guide surface 122 of the sleeve 100 and are engaged with the annular groove 140 of the nozzle 54. The balls 96 are prevented from being radially outward, by the inner surface 118 of the sleeve 100, and thus are placed in their locked state. For a short time after the fitting portion 136 of the suction nozzle 54 fits in the tapered hole 90 and before the sleeve 100 is moved back to its operative position, the adaptor 80 is elevated with the balls 96 being in their unlocked state. However, since the tapered outer surface 138 is tightly fitted in the tapered inner surface 89, the nozzle 54 is effectively prevented from coming off the adaptor 80. If the passage 66 is supplied with negative pressure from the negative-pressure supply device immediately after or before the nozzle 54 is attached to the adaptor 80, the negative pressure can surely prevent the nozzle 54 from coming off the adaptor 80.

As is apparent from the foregoing description of the illustrated embodiment, the adaptor 80 provides a holder-holding member which holds the suction nozzle 54 as a component holder such that the component holder is detachable from the holder-holding member. Alternatively, it can be thought that the adaptor 80 and the support shaft 53 cooperate with each other to provide the holder-holding member. In addition, the balls 96 provide rigid lock members which engage the annular groove 140, as an engaging recess as a sort of engaging portion, that is formed in the fitting portion 136 as a fitting shank, and locks the nozzle 54 to the adaptor 80 (or the suction shaft 53). The operable portion 108 as an operable member and the compression coil spring 104 as an elastic member cooperate with each other to provide a locked-state maintaining device.

In the present embodiment, the locked-state maintaining device can surely prevent the suction nozzle 54 from coming off the adaptor 80, as described above. In addition, the balls 96 are switched between their locked state and their unlocked state (i.e., the sleeve 100 is moved between its operative position and its retracted position) by utilizing the upward and downward movement of each mounting head 30, 31. Thus, two suction nozzles 54 can be exchanged with each other, easily and quickly, which contributes to improving the operation efficiency of the present EC mounting system. Moreover, it is not needed to employ an exclusive device to move the sleeve 100 to its retracted position, which leads to lowering the production cost of the present system.

The X-Y robots 36, 37, the rotating devices including the respective servomotors 52, and the elevating and lowering devices 62 cooperate with one another to provide two moving devices each of which moves a suction nozzle 54. However, each moving device may be one which includes a movable member that supports a support shaft 53 with a suction nozzle 54 such that the support shaft 53 is movable upward and downward; and an X-Y robot that moves the movable member to an arbitrary position in a horizontal plane. In the latter case, an elevating and lowering device that elevates and lowers the support shaft 53 cooperates with the X-Y robot to provide a moving device that moves the suction nozzle 54. Otherwise, the EC supplying devices 14, 15 and/or the PWB positioning and supporting device 12 may be modified to be able to move relative to the suction nozzle 54. Morever, the present invention is applicable to such an EC mounting system which employs a single EC supplying device, a single EC mounting device, and a single PWB conveyor.

Figure 9:
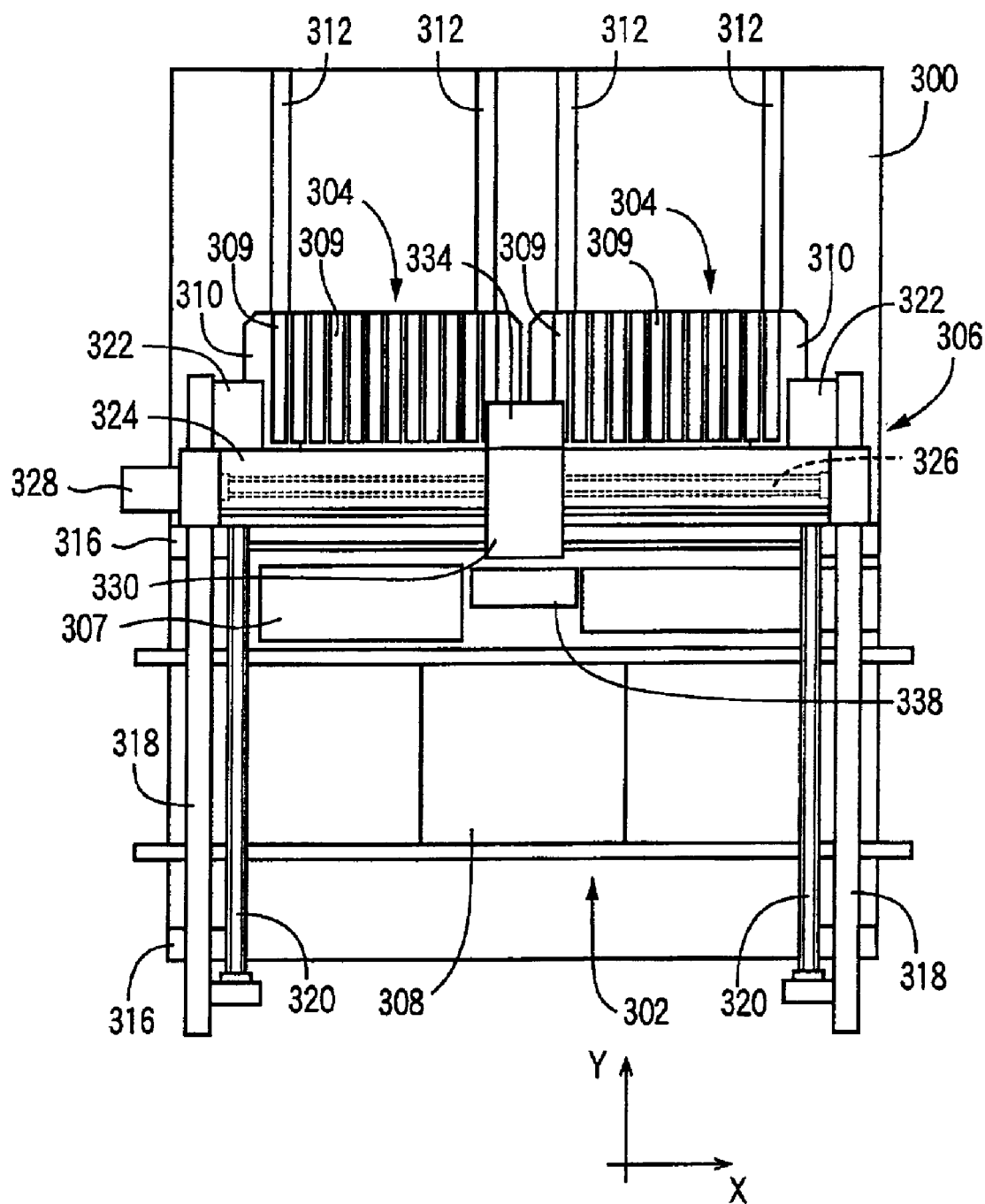
FIG. 9 is a schematic plan view of another electric-component (EC) mounting system including an EC mounting device including an EC holding apparatus as another embodiment of the present invention.

Next, there will be described a second embodiment of the present invention. FIG. 9 is a plan view of an EC mounting system as the second embodiment. The present system includes a machine base 300, and additionally includes a PWB conveyor 302, two EC supplying devices 304, and an EC mounting device 306 all of which are provided on the machine base 300. Moreover, a jaw storing device 307 is provided at a position between the EC supply devices 304 and the PWB conveyor 302. The PWB conveyor 302 conveys a printed wiring board (PWB) 308 as a circuit substrate, and positions and supports the PWB 308 at a predetermined EC-mount station. Thus, the PWB conveyor 302 also functions as a circuit-substrate supporting device. Each of the two EC supplying devices 304 includes a feeder table 310, and a plurality of EC feeders 309 which are detachably attached to the feeder table 310 such that respective EC-supply portions of the feeders 309 are arranged along a straight line parallel to an X-axis direction. Each of the EC feeders 309 stores a number of electronic components (ECs) of one sort, and supplies the ECs, one by one, from the EC-supply portion thereof. Each of the two feeder tables 310 is movable, while being guided by a pair of guide rails 312, between its EC-supply position and its retracted position in a Y-axis direction perpendicular to the X-axis direction.

The EC mounting device 306 includes an X-Y moving device, which includes four columns 316 which stand on the machine base 300; two guide rails 318 which are horizontally supported by the columns 316 such that the guide rails 318 extend parallel to the Y-axis direction; two feed screws 320; two Y-axis motors (servomotors) 322; a Y-axis slide 324 which is provided with two nuts, not shown, threadedly engaged with the two feed screws 320, respectively, and is moved in the Y-axis direction by the screws 320 and the motors 322 while being guided by the guide rails 318; a feed screw 326; an X-axis motor (servomotor) 328; and an X-axis slide 330 which is provided, together with the feed screw 326 and the X-axis motor 328, on the Y-axis slide 324 and is moved in the X-axis direction by the screw 326 and the motor 328. The X-axis slide 330 supports an EC holding head 334 which receives an EC 480 (FIG. 10) from an appropriate one of the two EC supplying devices 306, and conveys the EC 480 to a position above the PWB 308 positioned and supported by the PWB conveyor 302, along an EC-convey path below which an image taking device 338 is provided.

Figure 10:
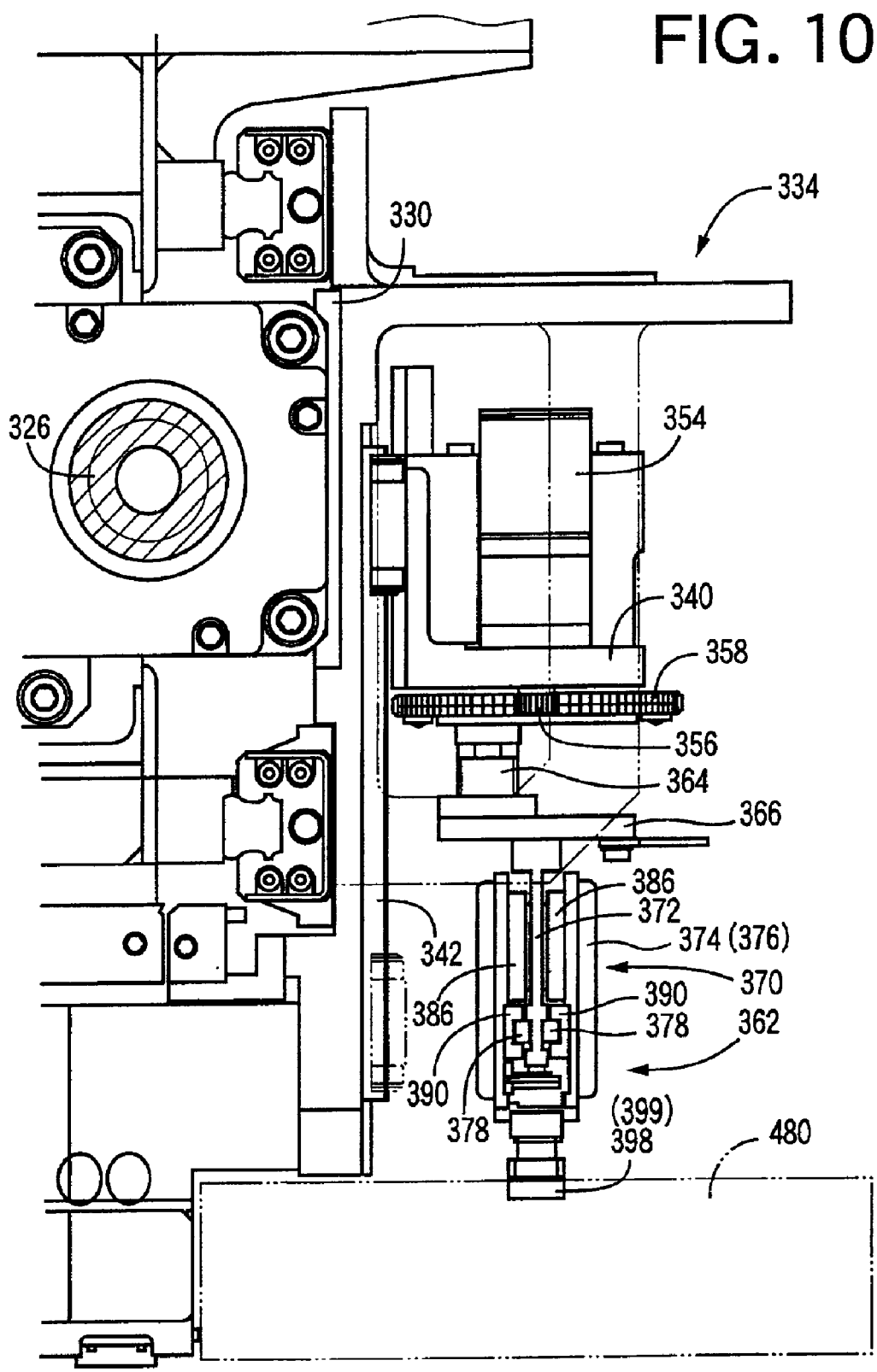
FIG. 10 is a side elevation view of the EC holding apparatus of the EC mounting system of FIG. 9.
Figure 11:
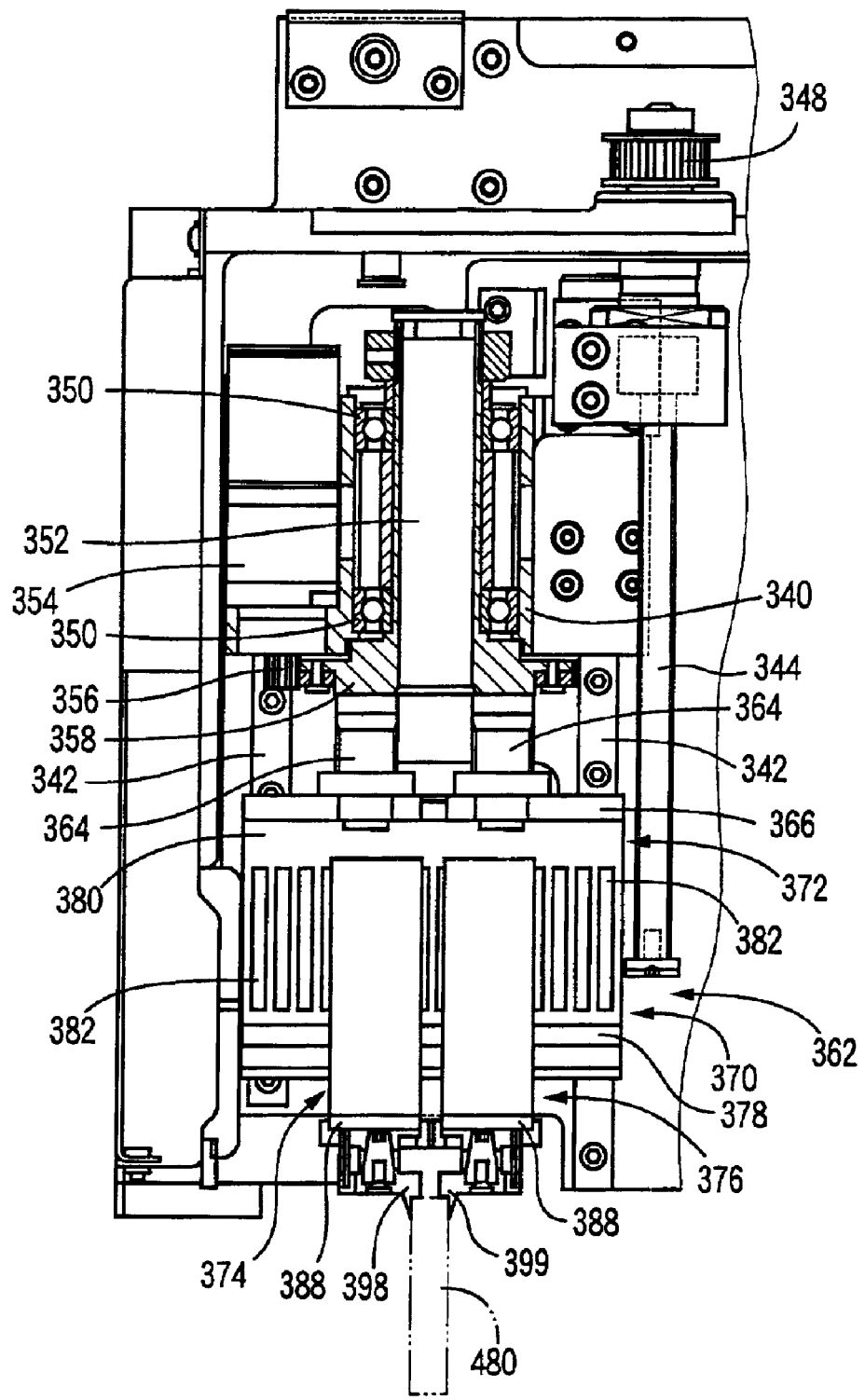
FIG. 11 is a front elevation view of the EC holding apparatus of FIG. 10.
Figure 15:
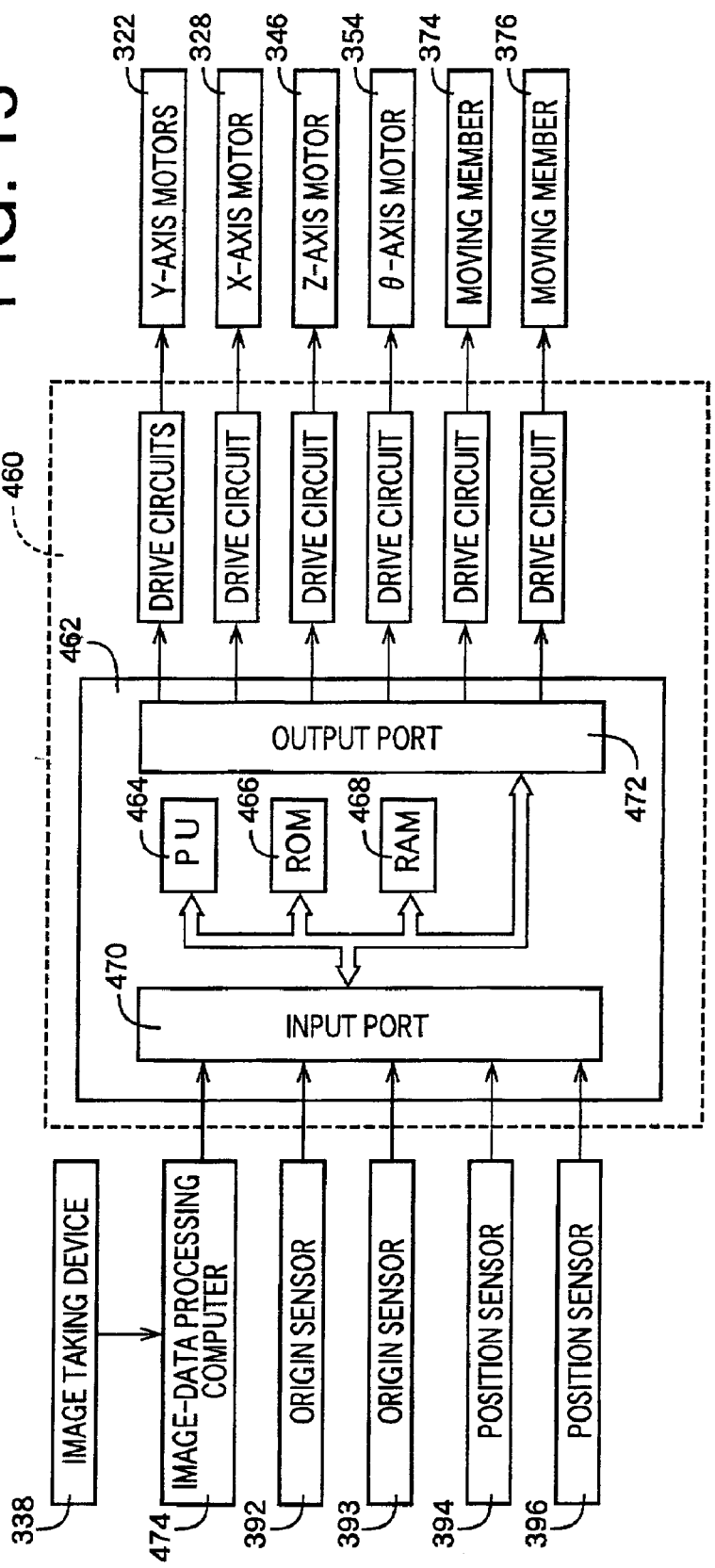
FIG. 15 is a diagrammatic view of a relevant portion of a control device of the EC mounting system of FIG. 9.

As shown in FIGS. 10 and 11, the EC holding head 334 includes an elevator member 340, as a main member thereof, that is supported by the X-axis slide 330 such that the elevator member 340 is movable upward and downward. The elevator member 340 is moved up and down by a feed screw 344 and a Z-axis motor 346 (servomotor; FIG. 15) while being guided by a pair of guide rails 342 provided on the X-axis slide 330. Reference numeral 348 designates a timing pulley as a transmitting device which transmits the rotation of the Z-axis motor 346 to the feed screw 344. The elevator member 340 supports a rotatable shaft 352 via bearings 350 such that the rotatable shaft 352 is rotatable about its vertical axis line relative to the elevator member 340 and is not movable in directions parallel to the axis line relative to the same 340. The rotatable shaft 352 is rotated by a θ-axis motor (servomotor) 354 via a pinion 356 and a gear (scissors gear) 358.

A main portion of the gear 358 is integral with a lower end portion of the rotatable shaft 352. A linear-motor-driven chuck 362 as a component holder is detachably attached to the main portion of the gear 358. More specifically described, an attaching member 366 is fixed to the main portion of the gear 358 via two connecting rods 364, and a stator 372 of a linear motor 370 as a main member of the chuck 362 is detachably attached to the attaching member 366. The linear motor 370 is a linear DC brushless motor, and includes, in addition to the above-indicated stator 372, two moving members 374, 376, and two guide members 378 for guiding the moving members 374, 376 in directions parallel to a lengthwise direction of the stator 372.

The stator 372 includes a main portion 380 which is formed of an aluminum alloy as a non-magnetic material, and a number of permanent magnets 382 which are fixed to the main portion 380. Each of the permanent magnets 382 has an elongate shape like a square bar, and one of opposite elongate side surfaces thereof has a north pole (N-pole) and the other long side surface has a south pole (S-pole). The main portion 380 supports the permanent magnets 382 such that the N-poles and the S-poles are alternate with each other in the lengthwise direction of the stator 372. The N-pole and S-pole side surfaces of each permanent magnet 382 somewhat project from opposite side surfaces of the main portion 380. The N-poles (or S-poles) on one of the opposite side surfaces of the main portion 380 and the N-poles (or S-poles) on the other side surface of the main portion 380 cooperate with each other to provide a zigzag pattern in a plan view of the main portion 380.

Each of the two moving members 374, 376 includes two iron cores 386 which face the opposite side surfaces of the main portion 380 of the stator 372, respectively. Respective lower end portions of the two iron cores 386 are connected to each other by a connecting member 388. Thus, each of the moving members 374, 376 has a generally U-shaped cross section. A U-phase coil, a V-phase coil, and a W-phase coil are wound around each iron core 386 to provide a coil unit. Each of the two coil units is designed such that under control of an electric current supplied to a corresponding one of the two moving members 374, 376, the each coil unit produces a force to linearly move the one moving member 374, 376 along the stator 372 owing to the interaction between the magnetic force produced by the each coil and the respective magnetic forces of the permanent magnets 382 of the stator 372.

The respective movements of the two moving members 374, 376 are guided by the two guide members 378 fixed to the opposite side surfaces of the main portion 380 of the stator 372. Two sliders 390 are fixed to opposed inner surfaces of each of the U-shaped moving members 374, 376, respectively, and are engaged with the two guide members 378, respectively, via balls, not shown. Thus, each of the moving members 374, 376 is lightly moved along the guide members 378.

Respective origin positions of the two moving members 374, 376 correspond to respective lengthwise opposite ends of the stator 372. Two origin sensors 392, 393 (FIG. 15) detect that the two moving members 374, 376 are positioned, or not positioned, at their origin positions, respectively. Two position sensors 394, 396 (FIG. 15) detect respective positions of the two moving members 374, 376 as respective distances thereof as measured from the respective origin positions. In the present embodiment, each of the origin sensors 392, 393 is provided by a transmission-type photoelectric sensor which includes a light emitting diode (LED) as a light emitter; a light receiver or detector for detecting a light emitted by the LED; and a shielding member which is provided on a corresponding one of the moving members 374, 376 and which shields, when the one moving member 374, 376 is positioned at its origin position, the light emitted by the LED and prevents the light from being detected by the light detector. However, the transmission-type photoelectric sensor may be replaced with a different sort of sensor, such as a reflection-type photoelectric sensor, a contact-type switch (e.g., a limit switch), or a proximity switch. In the present embodiment, each of the position sensors 394, 396 is provided by a magnetic linear scale ("Magnescale") including a magnetic scale having magnetic graduations and a magnetic-field detecting head which is moved on the magnetic scale while producing an electric signal indicating the current position of a corresponding one of the moving members 374, 376. However, the magnetic linear scale may be replaced with an optical linear scale or a different sort of position sensor. The two position sensors 394, 396 may employ a single common magnetic scale.

Figure 12:
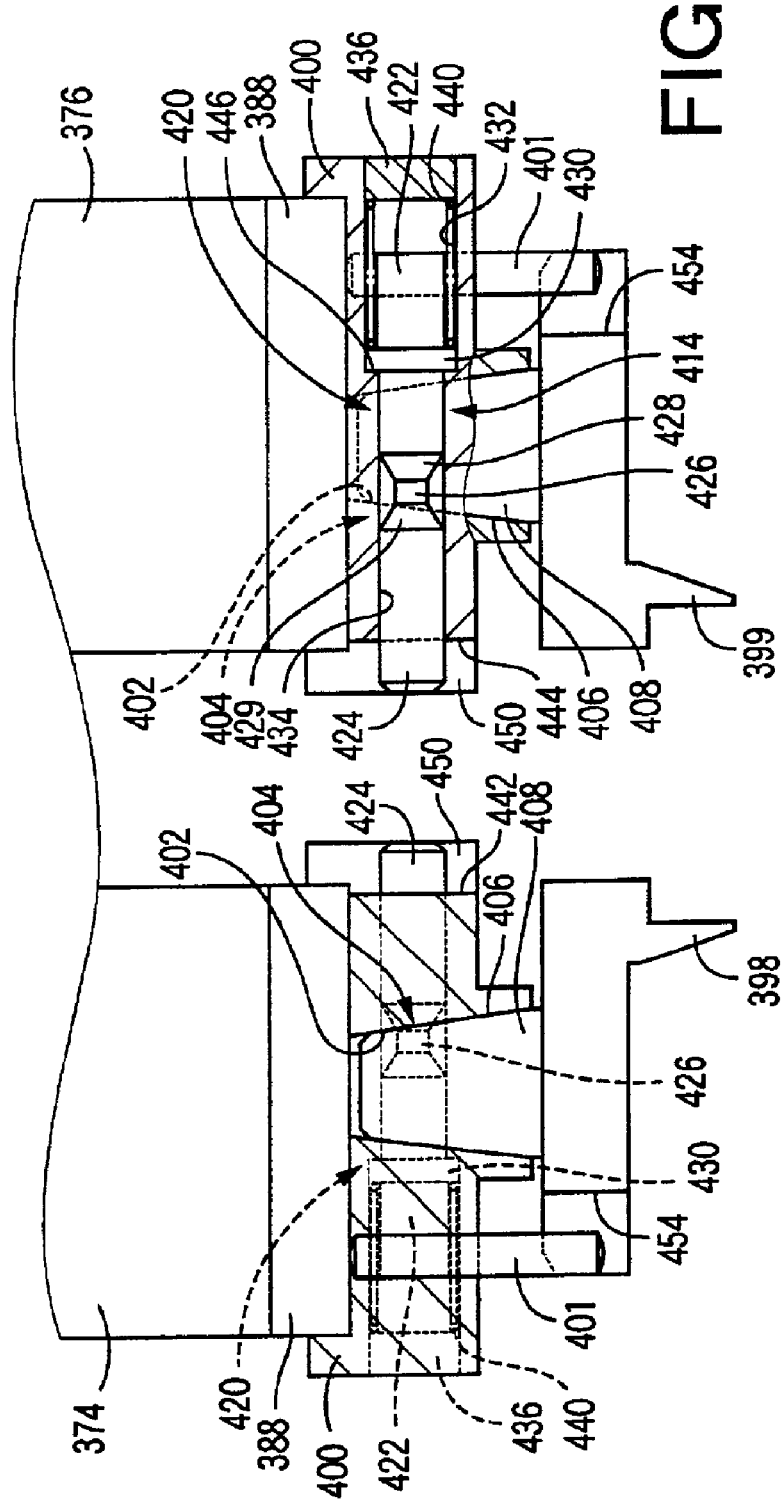
FIG. 12 is an enlarged, partly cross-sectioned, front elevation view of the EC holding apparatus of FIG. 10.
Figure 13:
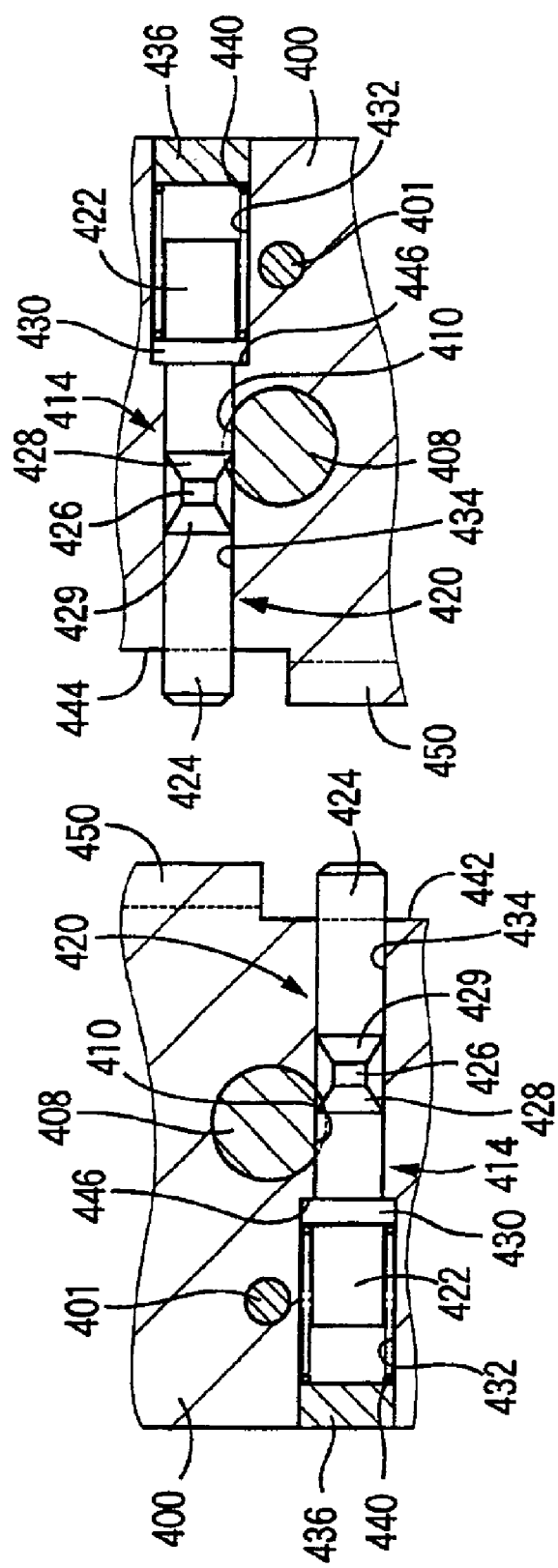
FIG. 13 is an enlarged, cross-sectioned, bottom view of the EC holding apparatus of FIG. 10.
Figure 14:
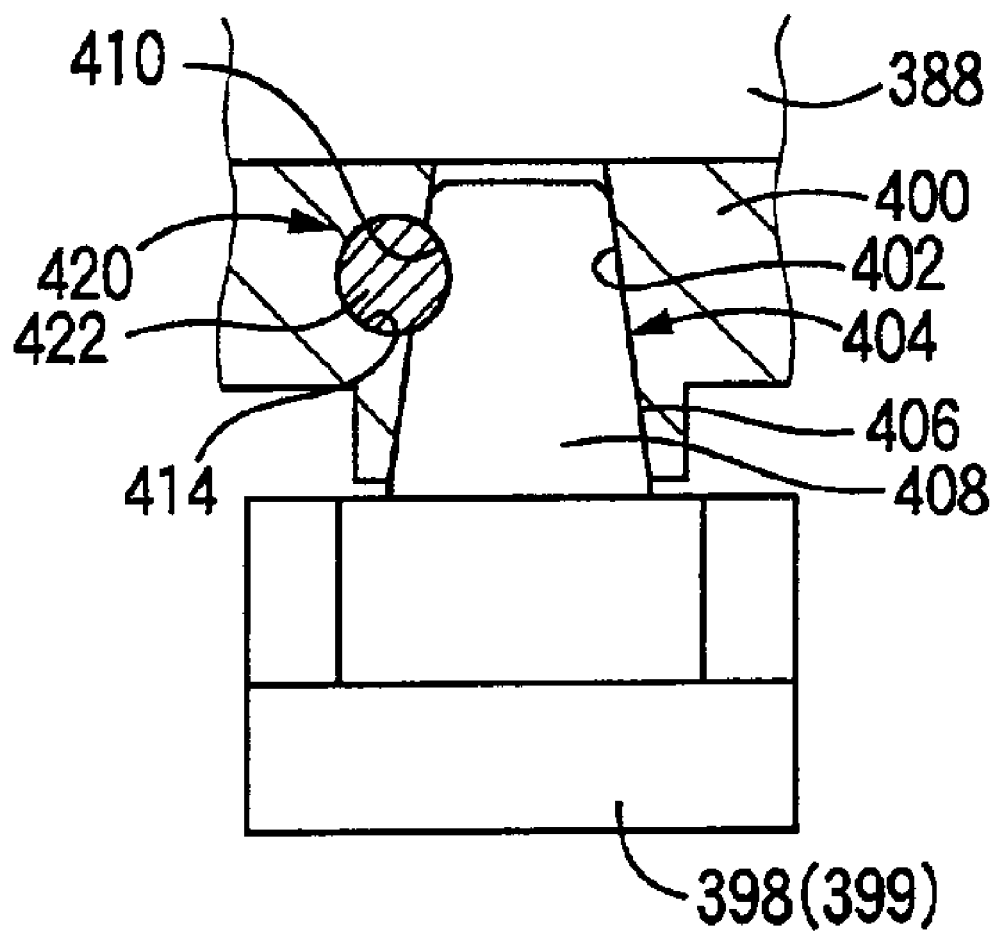
FIG. 14 is an enlarged, partly cross-sectioned, side elevation view of the EC holding apparatus of FIG. 10.

A pair of holding jaws 398, 399 which cooperate with each other to sandwich and hold the EC 480 are detachably attached to the respective connecting members 388 of the two moving members 374, 376. In the present embodiment, the jaw storing device 307 (FIG. 9) stores different sorts of holding jaws 398, 399 corresponding to different sorts of ECs 480, respectively. The current pair of jaws 398, 399 are replaced with a new pair of jaws 398, 399 of a different sort, depending upon the sort of new ECs 480 to be mounted by the EC holding head 334. As shown in the enlarged view of FIG. 12, each of the two connecting members 388 supports an attaching member 400 and a positioning pin 401, and each of the two holding jaws 398, 399 includes a tapered shank 408 which can fit in a tapered hole 404 of the attaching member 400 such that a tapered, outer circumferential surface 406 of the tapered shank 408 engages a tapered, inner circumferential surface 402 of the tapered hole 404. As shown in FIGS. 13 and 14, a portion of the tapered shank 408 as seen in a circumferential direction thereof is cut away to provide a recess 410 having an arcuate transverse cross section.

Each of the two attaching members 400 has a holding hole 414 which extends in a direction perpendicular to an axis line of the tapered hole 404, such that the holding hole 414 partly interferes with the tapered hole 404, i.e., partly overlaps the same 404, as illustrated in FIG. 13. A lock pin 420 fits in each holding hole 414 such that the lock pin 420 is movable in an axial direction of the holding hole 414. Each lock pin 420 has a circular transverse cross section, and has a stepped cylindrical shape including different axial portions having different diameters. More specifically described, the lock pin 420 has, in an axially intermediate portion thereof, an annular groove having a trapezoidal transverse cross section, and includes a small-diameter portion 426 corresponding to the annular groove, and a base end portion 422 as one end portion of the pin 420, and a free end portion 424 as the other end portion of the pin 420. The lock pin 420 additionally includes a tapered portion 428 between the small-diameter portion 426 and the base end portion 422, and a tapered portion 429 between the small-diameter portion 426 and the free end portion 424. The base end portion 422 of each lock pin 420 has a flange portion 430 having a diameter greater than that of the remaining portion of the pin 420. Each holding hole 414 is a stepped hole including a great-diameter portion 432 and a small-diameter portion 434. The small-diameter portion 434 has an open end opening outward, and the great-diameter portion 432 has an end closed by a closure member 436. A compression coil spring 440 as an elastic member as a sort of biasing device is provided between the flange portion 430 of the lock pin 420 and the closure member 436. The respective coil springs 440 of the two moving members 374, 376 bias the respective lock pins 420 toward each other, so that normally, the respective free end portions 424 of the two lock pins 420 are held at their operative positions where the two lock pins 420 partly project from respective side surfaces 442, 446 of the two attaching members 400 that face each other. A limit of projecting amount of each lock pin 420 from the corresponding attaching member 400 is defined by abutment of the flange portion 430 on a shoulder surface 446 formed between the great-diameter portion 432 and the small-diameter portion 434. The two attaching members 400 includes respective operating portions 450 which project from the respective side surfaces 442, 444 such that the operating portion 450 of each of the attaching members 400 faces the lock pin 420 of the other attaching member 400.

In a state in which the tapered shank 408 of each moving member 374, 376 fits in the tapered hole 404 of the corresponding attaching member 400, if the corresponding lock pin 420 is moved to its operative position by the biasing force of the corresponding coil spring 440, the base end portion 422 of the pin 420 engages the recess 410 of the tapered shank 408, so that the tapered shank 404 is placed in a locked state in which the shank 408 is prevented from coming off the tapered hole 404. In addition, the positioning pin 401 fits in a positioning recess 454 formed in each holding jaw 398, 399, thereby preventing each jaw 398, 399 from being rotated about its tapered shank 408. Thus, each jaw 398, 399 is secured to the corresponding moving member 374, 376, such that the each jaw 398, 399 is not movable relative to the corresponding moving member 374, 376.

The present EC mounting system is controlled by a control device 460 shown in FIG. 15. However, FIG. 8 shows only a relevant portion of the EC mounting system that is relevant to the present invention. The control device 460 is essentially provided by a computer 462 including a processing unit (PU) 464, a read only memory (ROM) 466, a random access memory (RAM) 468, an input port 470, an output port 472, and a bus line for connecting those elements 464, 466, 468, 470, 472 to one another. An image-data processing computer 474 which processes image data representing the image taken by the image taking device 338, is connected to the input port 470. In addition, the origin sensors 392, 393, the position sensors 394, 396, other sensors, and other computers are also connected to the input port 470. The output port 472 is connected via respective drive circuits to the Y-axis motors 322, the X-axis motor 328, the Z-axis motor 345, the θ-axis motor 354, and the two moving members 374, 376 of the chuck 362. The ROM 466 stores various control programs including an electric-circuit assembling routine and a holding-jaw exchanging routine. The electric-circuit assembling routine is described in detail in U.S. patent application Ser. No. 09/745,442, and accordingly a detailed description thereof is omitted here.

After the PWB conveyor 302 positions the PWB 308 at the predetermined EC-mount position shown in FIG. 9, the control device 460 reads out, from the RAM 468, control data relating to an EC 480 that is to be mounted next on the PWB 308. This control data include identification (ID) data identifying a sort of the EC 480, an EC taking position where the EC holding head 334 or the chuck 362 takes the EC 480 of that sort from one of the EC feeders 309 of the EC supplying devices 16, and a mounting position where the chuck 362 mounts the EC 480 on the PWB 308. The control device 460 moves, according to this control data, the chuck 362 to the EC taking position, and then the control device 460 opens the chuck 362. More specifically described, the control device 460 reads out, based on the ID data identifying the sort of the EC 480, distance data indicating respective prescribed distances of respective portions of the EC 480 that are to be held by the two holding jaws 398, 399, from a reference position, i.e., the centerline of the chuck 362. Then, the control device 460 opens each of the two moving members 374, 376 to position a corresponding one of the two holding jaws 398, 399 at a position which is more distant from the reference position than a corresponding one of the read-out prescribed distances by a predetermined distance.

The reference position, i.e., the centerline of the chuck 362 coincides with the axis line of rotation of the rotary shaft 352 in the state in which the chuck 362 is attached to the attaching member 366. In the case where the EC 480 is one which has a plane-symmetric shape with respect to at least a first plane perpendicularly intersecting the direction in which the two holding jaws 398, 399 are moved toward, and away from, each other, the two jaws 398, 399 of the chuck 362 are opened symmetrically with respect to a second plane including the axis line of rotation of the rotatable shaft 62. On the other hand, in the case where the EC 480 is one which has an asymmetric shape with respect to the above-indicated first plane, the two jaws 398, 399 are opened asymmetrically with respect to the above-indicated second plane.

After the chuck 362 is opened in this way, the control device 460 controls the Z-axis motor 346 to move the elevator member 340 downward to a height position where the chuck 362 can hold the EC 480. Then, the chuck 362 is closed to hold the EC 480 with an appropriate holding force. When the chuck 362 is moved upward, the EC 480 is taken from the EC supplying device 304.

Figure 16:
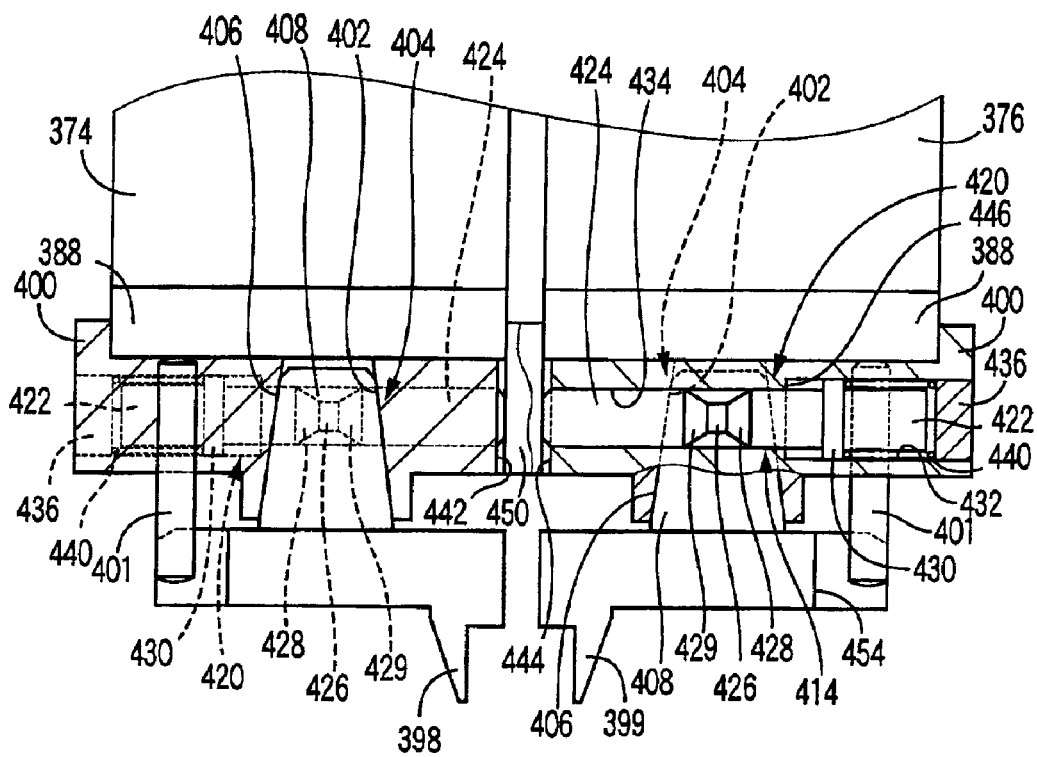
FIG. 16 is a partly cross-sectioned, front elevation view showing a state in which a lock pin as a lock member of the EC holding apparatus of FIG. 10 is held at its retracted position.
Figure 17:
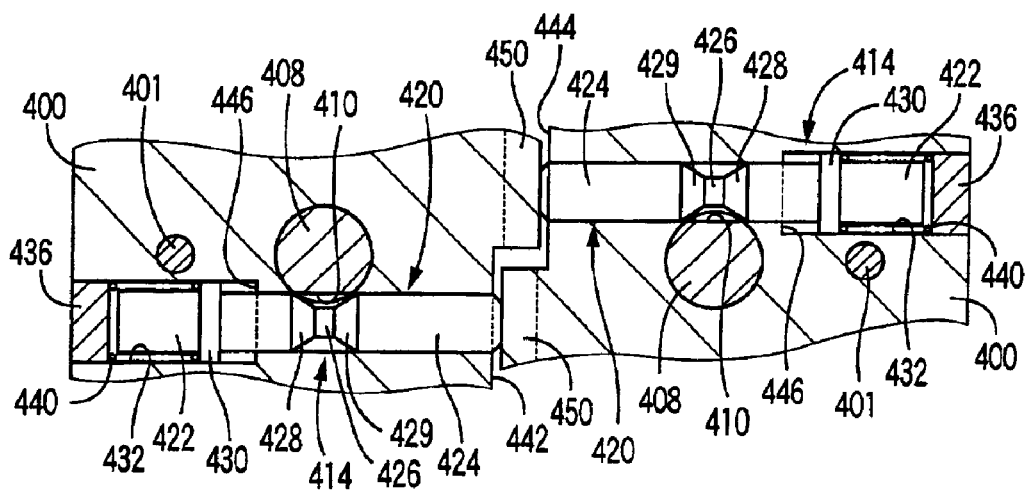
FIG. 17 is a cross-sectioned, plan view of the EC holding apparatus of FIG. 10.
Figure 18:
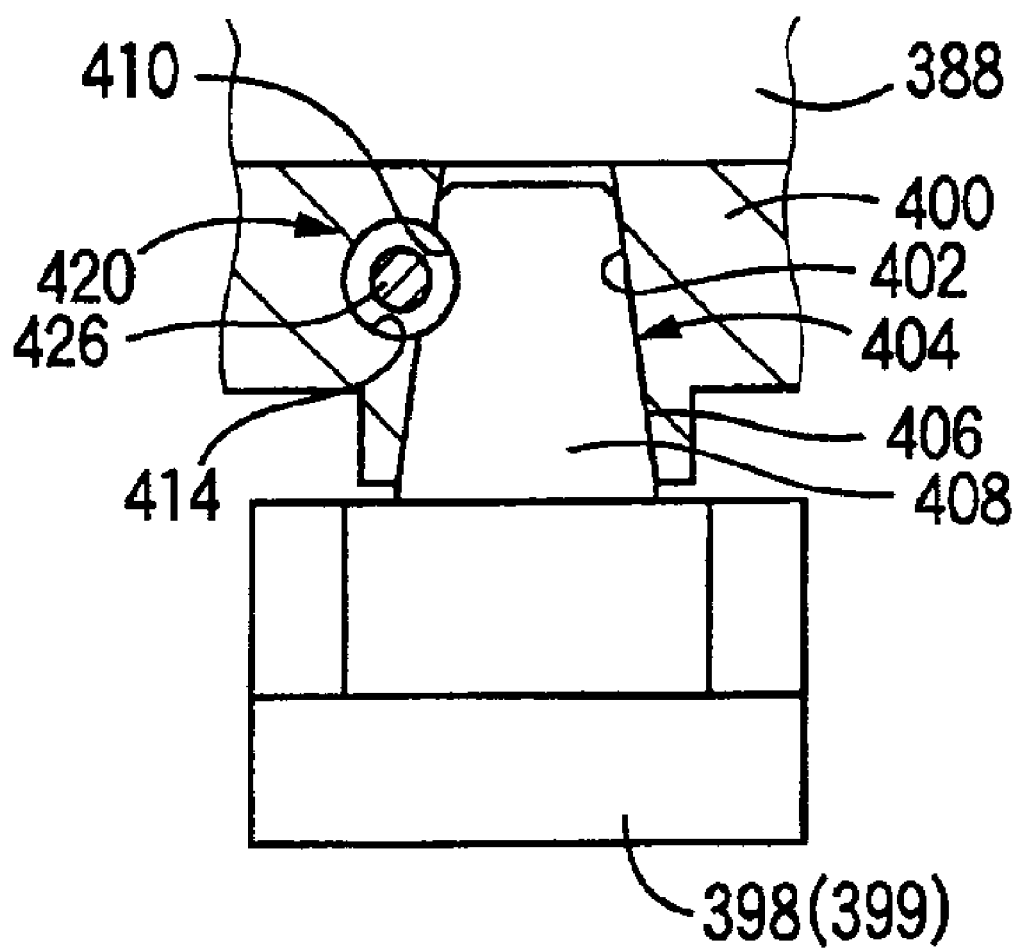
FIG. 18 is a partly cross-sectioned, side elevation view of the EC holding apparatus of FIG. 10.

The present EC mounting system automatically exchanges the current pair of holding jaws 398, 399 with another pair of holding jaws 398, 399 which are stored in the jaw storing device 307, which is provided between the EC supplying devices 30 and the PWB conveyor 302, as shown in FIG. 9. When the exchanging of the current jaws 398, 399 is needed, first, the EC holding head 334 is moved to a position above the jaw storing device 307. Then, the tapered shank 408 and the tapered hole 404 are unlocked from their locked state. This unlocking will be described in detail by reference to FIGS. 16, 17, and 18. As described above, the two moving members 374, 376 are moved toward each other by respective appropriate distances so that the two holding jaws 398, 399 hold the EC 480. If the two moving members 374, 376 are further or specially moved toward each other over the appropriate or limitative distances, the free end portion 424 of the lock pin 420 of one of the two moving members 374, 376 is pushed by the operating portion 450 of the other moving member 374, 376, so that the lock pin 420 is moved to its retracted position against the elastic or biasing force of the coil spring 440. Abutment of the vertical, side surface of the operating portion 450 of one of the two moving members 374, 376 against the vertical, side surface of the connecting member 388 of the other moving member, defines a limit of the special movement of the two moving members 374, 376 toward each other. In an unlocked state in which the lock pin 420 is held at its retracted position, the small-diameter portion 426 and the two tapered portions 428, 429 of the lock pin 420 faces the recess 410 of the tapered shank 408, so that the annular groove defined by the small-diameter portion 426 and the tapered portions 428, 429 allows the tapered shank 408 to be removed from the tapered hole 404. Then, the chuck 362 is moved down toward the jaw storing device 307. After a movable member of the storing device 307 is moved and engaged with the holding jaws 398, 399, the chuck 362 is moved up, so that the holding jaws 398, 399 are removed from the chuck 362 and are stored in the storing device 307. The attachment of new holding jaws 398, 399 is carried out in an order opposite to the order of description. In short, in the unlocked state in which each lock pin 420 is held at its retracted position, the tapered shank 408 of the corresponding holding jaw 398, 399 fits in the tapered inner surface 402 of the corresponding attaching member 400, subsequently the chuck 362 is moved up away from the jaw storing device 307, and then the lock pin 420 is moved to its operative position, so that the holding jaw 398, 399 is locked to the attaching member 400.

In the EC mounting system described above, the linear-motor-driven chuck 362 includes the two holding jaws 398, 399 for sandwiching the EC 480 in one direction and thereby holding the same 480. However, the chuck 362 may be replaced by a different linear-motor-driven chuck which includes more than two holding jaws, e.g., includes two linear motors for moving two pairs of moving members, respectively, two of which are moved toward, and away from, each other in a first direction, the other two of which are moved toward, and away from, each other in a second direction perpendicular to the first direction, and all of which cooperate with one another to hold an EC.

In the present embodiment, the two holding jaws 398, 399 provides a sort of component holder; the moving members 374, 376 and the attaching members 400 cooperate with each other to provide a holder-holding member having the tapered holes 404 each as a fitting hole; and each of the tapered shanks 408 provides a fitting portion. In addition, each of the recesses 410 provides an engaging portion. Each of the lock pins 420 provides a lock bar as a sort of a lock member. The free end portion 424 of each lock pin 420 provides an operable member which receives an operating force to move the each pin 420 to its retracted position. Thus, in the present embodiment, the operable member is an integral portion of the lock pin 420 as the lock member. The above-described operable member cooperates with the compression coil spring 440 to provide a locked-state maintaining device. Moreover, the attaching member 366 provides a main member of the chuck 362; and the linear motor 370 provides a drive device which drives or moves the holding jaws 398, 399. The tapered hole 404 as a fitting hole, the tapered shank 408 as a fitting portion, and a lock device cooperate with one another to provide an attaching device which attaches each holding jaw 398, 399 to the corresponding moving member 374, 376. The lock device includes the recess 410, the holding hole 414, the lock pin 420 as a sort of lock bar, the compression coil spring 440 as an elastic member, and the operating portion 450 as an operating member. In the present embodiment, the operating member is integral with the holder-holding member.

In the present embodiment, the above-described locked-state maintaining device prevents the holding jaws 398, 399 from coming off the moving members 374, 376, even if an upward movement of the moving members 374, 376 is started at a high acceleration or a downward movement of the same 374, 376 is stopped at a high deceleration. In addition, since the locked state is unlocked by specially moving the moving members 374, 376 over the appropriate distances needed to hold the EC 480, the current pair of holding jaws 398, 399 can be easily exchanged with another pair of holding jaws.

Figure 19:
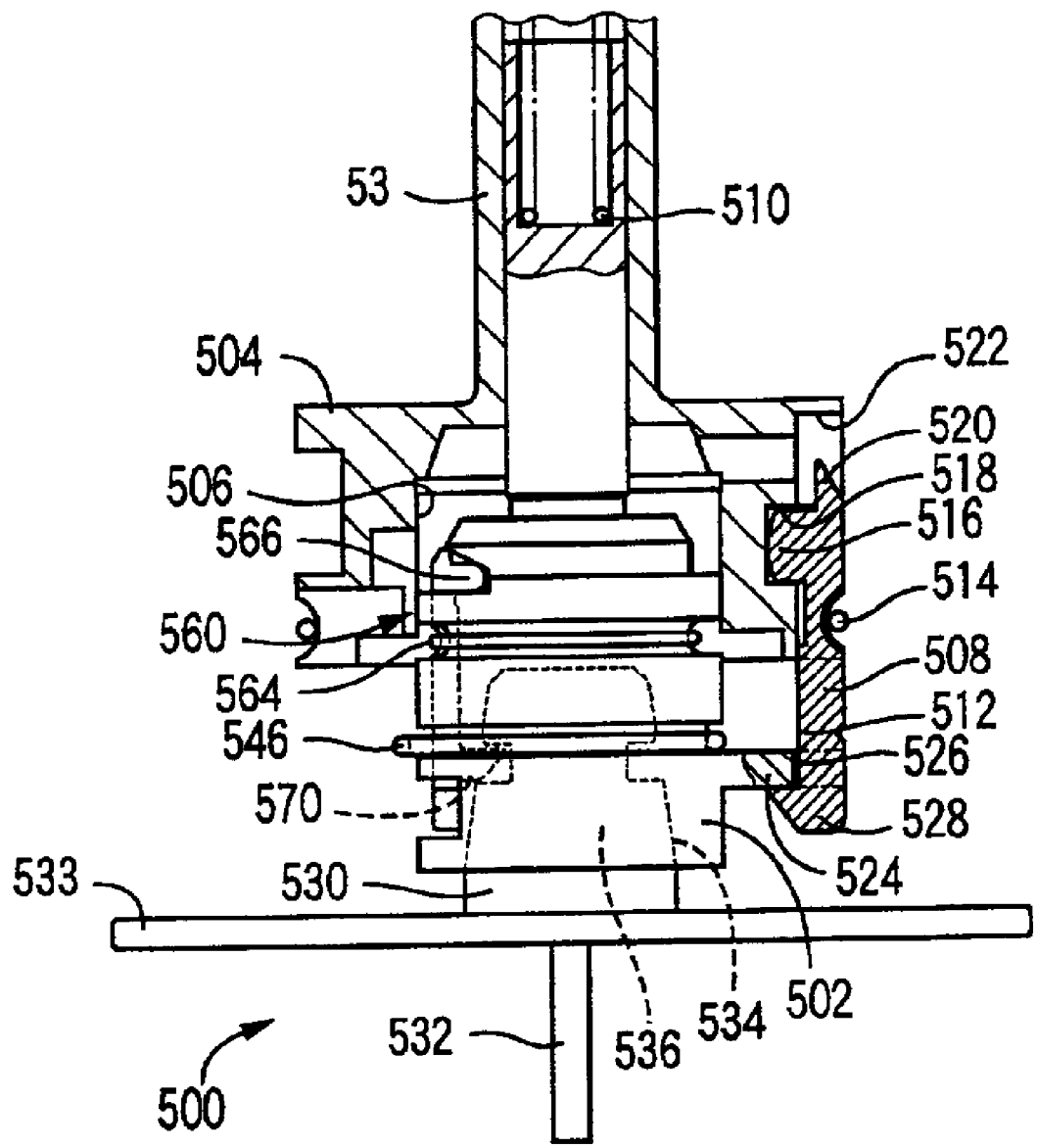
FIG. 19 is a partly cross-sectioned, plan view of another EC holding apparatus as another embodiment of the present invention.

Next, there will be described a third embodiment of the present invention by reference to FIGS. 19 to 22. The third embodiment also relates to an EC mounting system. The same reference numerals as used in the first embodiment shown in FIGS. 1 to 8 are used to designate corresponding elements or parts of the third embodiment, and the description thereof is omitted. The present EC mounting system employs, as a component holder, a suction nozzle 500 shown in FIG. 19. The suction nozzle 500 is attached to a support shaft 53 via an adaptor 502. The adaptor 502 and the support shaft 53 cooperate with each other to provide a holder-holding member. Otherwise, it can be said that the adaptor 502 provides the holder-holding member. The suction nozzle 500 applies suction or negative pressure to an EC and thereby holds the EC, and is connected to a negative-pressure supply device via a passage provided in the support shaft 53, and a pressure switch valve (not shown in FIG. 19). The adaptor 502 fits in a fitting hole 506 of a nozzle holding portion 504 provided by a lower end portion of the support shaft 53, such that the adaptor 502 is movable relative to the shaft 53 in an axial direction thereof. The adaptor 502 is held by a plurality of holding members 508 (only one member 508 is shown in FIG. 19) that are provided on the nozzle holding portion 504 such that the holding members 508 are equiangularly spaced from each other about an axis line of the support shaft 53. A compression coil spring 510 as an elastic member as a sort of biasing device biases the adaptor 502 in a direction in which the adaptor 502 may project downward from the nozzle holding portion 504.

The nozzle holding portion 504 has a plurality of axial recesses 512 that extend in the axial direction of the support shaft 53 and are equiangularly spaced from each other about the axis line of the shaft 53. Each of the holding members 508 fits in a corresponding one of the axial recesses 512, such that the each holding member 508 is pivotable. A ring-like spring member 514 that is wound around the nozzle holding portion 504 attaches the holding members 508 to the holding portion 504. Each of the holding members 508 has, in its upper end portion, a projection 516 which projects toward the centerline of the nozzle holding portion 504 and fits in a recess 518 formed in the holding portion 504. Thus, each of the holding members 508 is pivotable about its projection 516 fitting in the recess 518, more specifically, about an axis line that is perpendicular to a lengthwise direction of the each member 508 and is parallel to a tangent line to a portion of the holding portion 504 to which the each member 508 is attached.

Each of the holding members 508 additionally has, above its projection 516 of in its upper end portion, an operable portion 520 which fits in a recess 522 formed in the nozzle holding portion 504. Since each of the holding members 508 fits in the corresponding recess 512 and the operable portion 520 of the each holding member 508 fits in the corresponding recess 522, the each member 508 is effectively prevented from being pivoted about an axis line perpendicular to the axis line of the support shaft 53.

A lower end portion of each of the holding members 508 fits in a recess 526 that is formed in a great-diameter engaging portion 524 of the adaptor 502. Thus, the adaptor 502 is effectively prevented from being rotated relative to the nozzle holding portion 504. Each of the holding members 508 has, in its lower end portion, an engaging projection 528 which projects toward the adaptor 502 and engages a lower surface of the engaging portion 524. Thus, the adaptor 502 is effectively prevented from coming off the fitting hole 506. In this state, if the respective operable portions 520 of the holding members 508 are manually pushed by an operator so as to pivot the holding members 508 against the biasing force of the spring member 514 and thereby disengage the engaging projections 528 of the members from the engaging portion 524, then the adaptor 502 can be removed from the nozzle holding portion 504.

Figure 20:
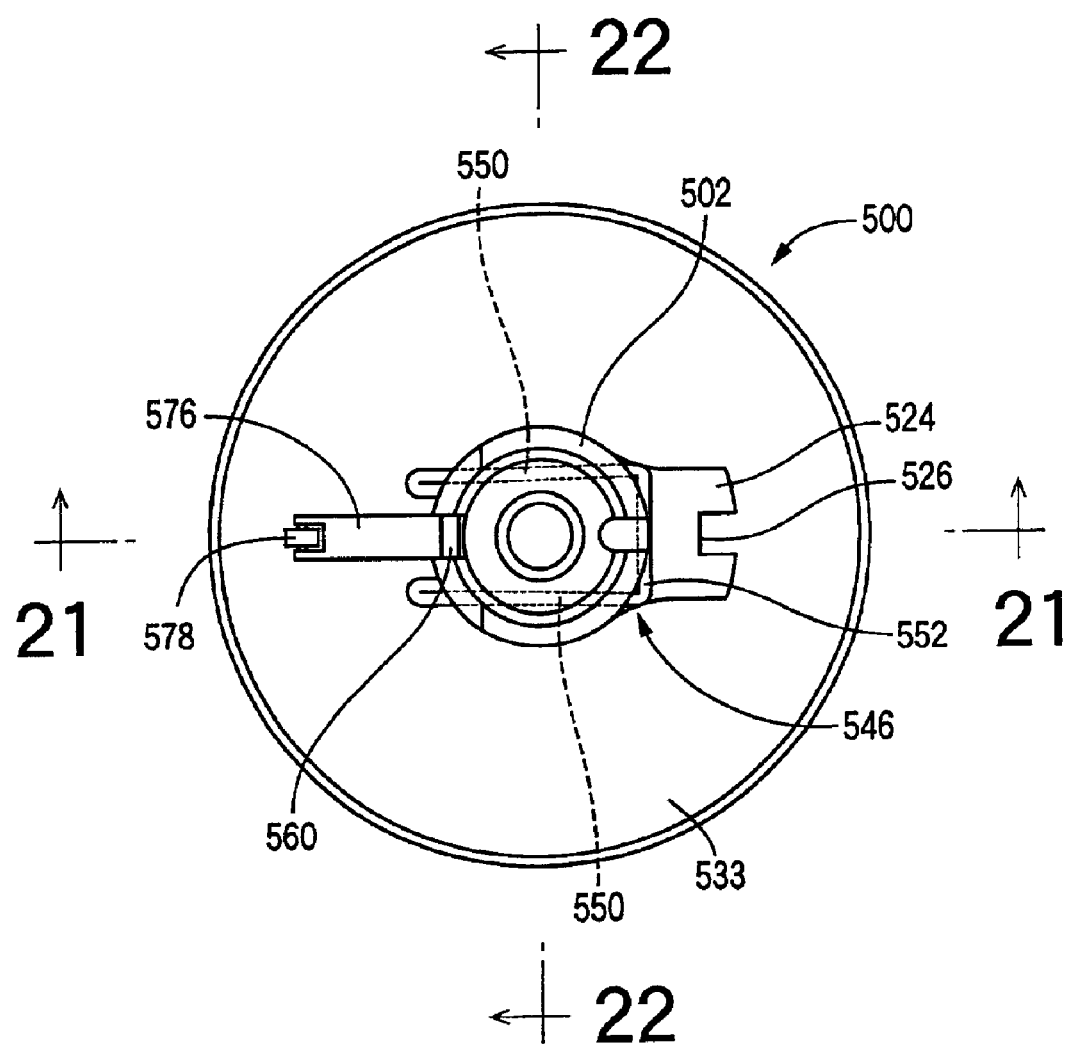
FIG. 20 is a plan view of the EC holding apparatus of FIG. 19.
Figure 21:
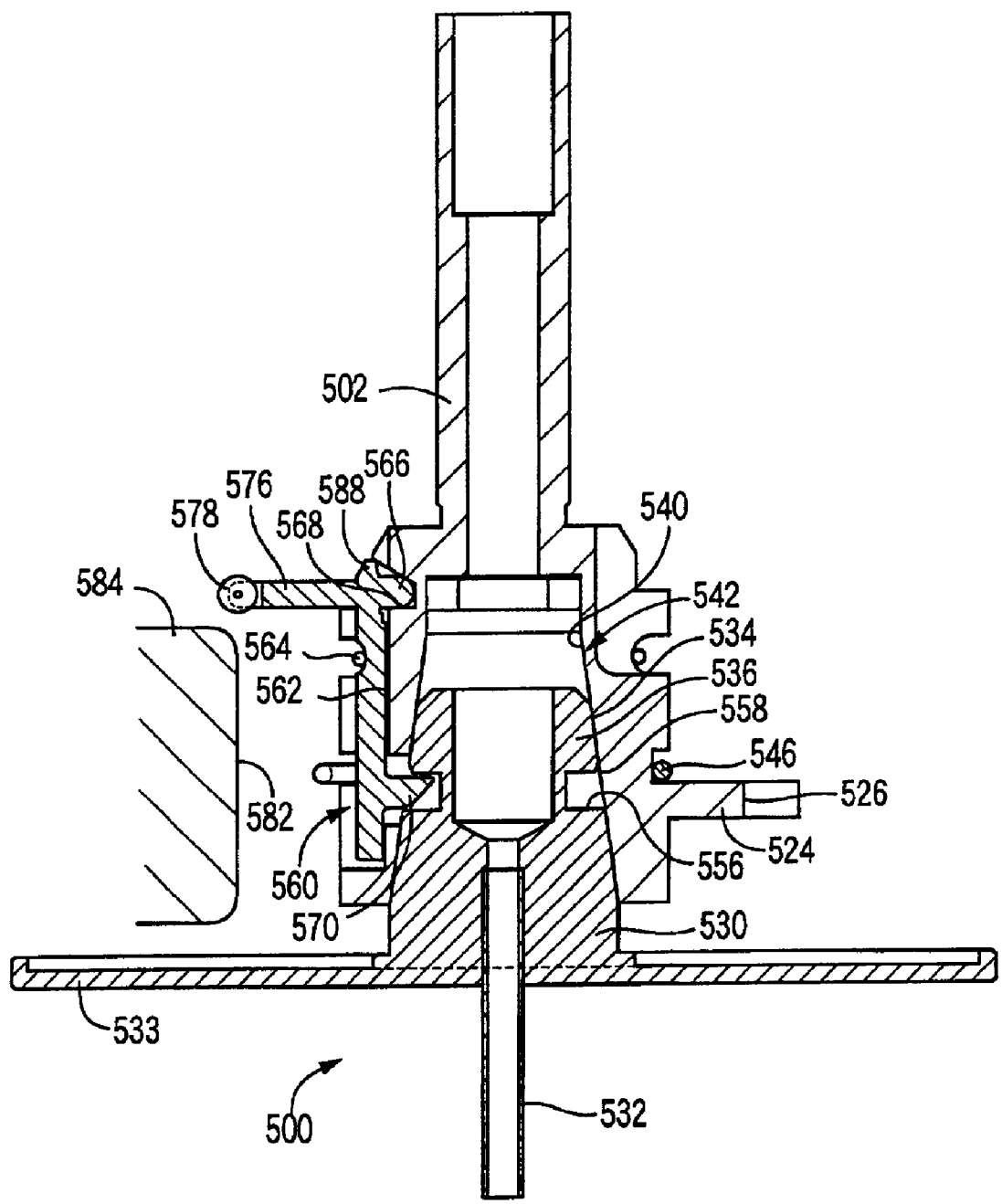
FIG. 21 is a cross-sectioned view of the EC holding apparatus, taken along plane 21—21 in FIG. 20.
Figure 22:
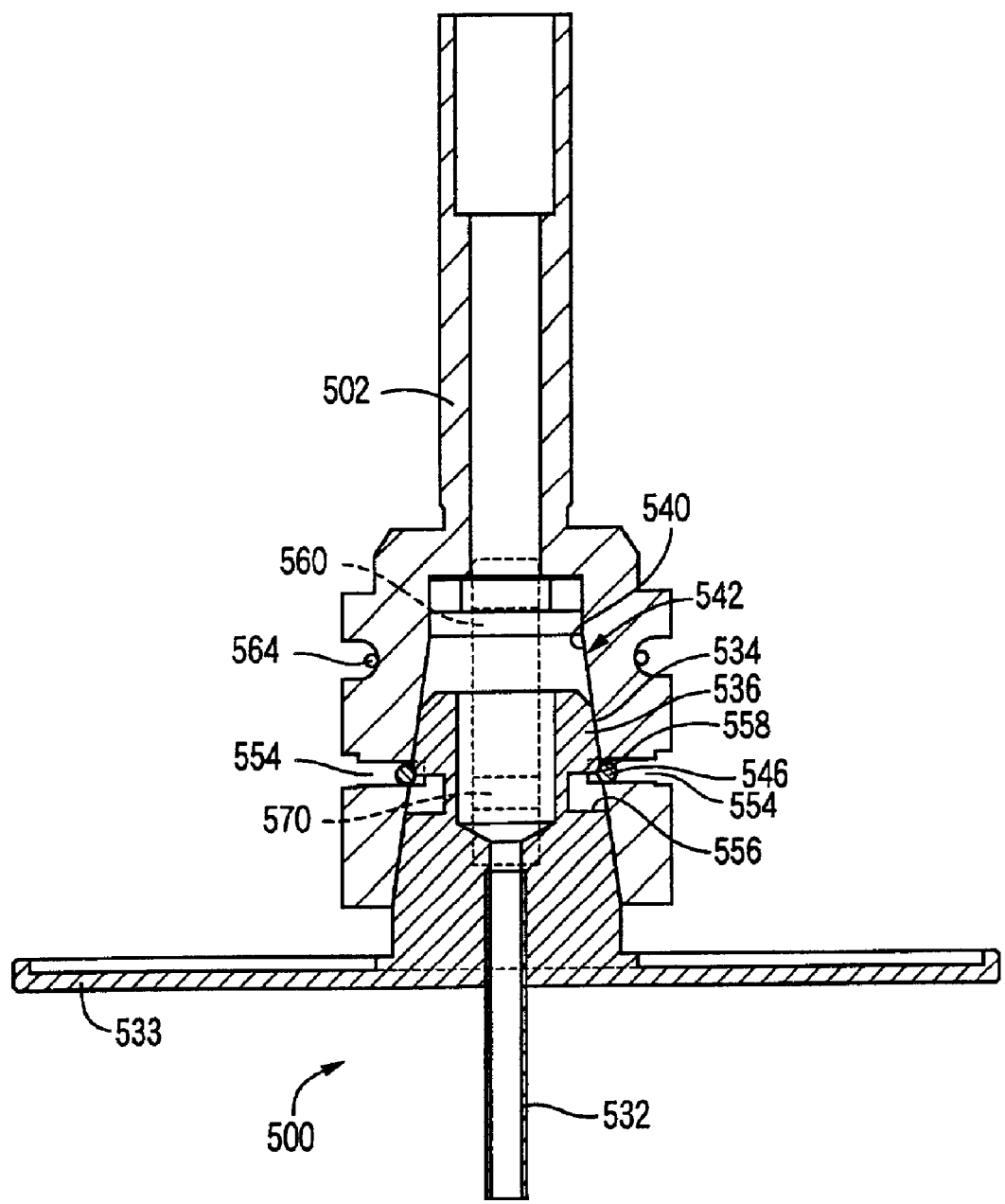
FIG. 22 is a cross-sectioned view of the EC holding apparatus, taken along plane 22—22 in FIG. 20.

The suction nozzle 500 includes a suction-pipe holder 530, and a suction pipe 532 held by the suction-pipe holder 530. Reference numeral 533 designates a disc-like light-emitting portion. As shown in FIGS. 21 and 22, the suction-pipe holder 530 includes a tapered shank 536 having a tapered, outer circumferential surface 534, and fits in a tapered, inner circumferential surface 540 of a tapered hole 542 of the adaptor 502. A spring member 546 attaches the suction-pipe holder 530 to the adaptor 502. As shown in FIG. 20, the spring member 546 has a generally U-shaped configuration including a pair of arm portions 550 and a connecting portion 552 connecting between respective base portions of the two arm portions 550. The two arm portions 550 of the spring member 546 fit in two recesses 554 (FIG. 22), respectively, that are formed in the adaptor 502. The distance between the two arm portions 550 decreases in a direction toward respective free ends thereof, thereby securing the suction-pipe holder 530 to the adaptor 502. The respective free ends of the two arm portions 550 are bent inward, so as to prevent the spring member 546 from coming off the adaptor 502. As shown in FIGS. 21 and 22, the suction nozzle 500 has an annular groove 556, and a tapered surface 558 formed in an open end of an upper wall of the annular groove 556. The tapered surface 558 is inclined such that, in a direction toward a bottom wall of the annular groove 556, the tapered surface 558 approaches a center axis line of the suction nozzle 500. The suction nozzle 500 has the tapered surface 558 at a position which assures that, in a state in which the tapered shank 536 fits in the tapered hole 542, the tapered surface 558 faces the spring member 546. The spring member 546 being elastically deformed engages the tapered surface 558, thereby holding the suction-pipe holder 530 and drawing the same 530 into the tapered hole 542.

The suction nozzle 500 is locked to the adaptor 502 by a lock lever 560 which is attached to the adaptor 502 such that the lock lever 560 is pivotable about an axis line which is perpendicular to the axis line of the support shaft 53 but does not intersects the axis line. As shown in FIG. 21, the adaptor 502 has an axial recess 562 that extends parallel to the axis line of the support shaft 53, and the lock lever 560 fits in the axial recess 562 such that the lock lever 560 is pivotable in the recess 562. A ring-like spring member 564 that is wound around the adaptor 502 attaches the lock lever 560 to the adaptor 502. The lock lever 560 has, in its upper end portion, a projection 566 which projects toward the center axis line of the adaptor 502 and which fits in a recess 568 formed in the adaptor 502. The lock lever 560 is pivotable about a center of a cylindrical outer surface of its projection 566 fitting in the recess 568, more specifically, about an axis line that is perpendicular to a lengthwise direction of the lock lever 560 and is parallel to a tangent line to a portion of the adaptor 502 to which the lock lever 560 is attached. Since the lock lever 560 fits in the recesses 562, 568, the lever 560 is effectively prevented from being rotated about an axis line perpendicular to the axis line about which the lever 560 is pivotable.

The lock lever 560 has, in its lower portion, an engaging projection 570 which projects toward the center axis line of the adaptor 502. When the lock lever 560 is held at its operative position in which the engaging projection 570 of the lever 560 is engaged with the annular groove 556 of the suction nozzle 500, i.e., held in its locked state, the lever 560 prevents the nozzle 560 from coming off the adaptor 502. The lock lever 560 additionally has, in its upper end portion, an operable portion 576 which projects in a direction away from the center axis line of the adaptor 502 and which supports, at its free end, a rotatable roller functioning as a cam follower 578. Meanwhile, a stationary cam 584 (FIG. 21) having a cam surface 582 is provided at a suction-nozzle exchanging position on the present EC mounting system. As the support shaft 53 is lowered at the suction-nozzle exchanging position, the cam follower 578 engages and follows the cam surface 582 of the stationary cam 584, so that the lock lever 560 is pivoted to its retracted position against the biasing force of the spring member 564. The support shaft 53 is further lowered in the state in which the lock lever 560 is held at its retracted position. When the lock lever 560 is pivoted to its retracted position and the engaging projection 570 is disengaged from the annular groove 556, that is, the lever 560 is unlocked from its locked state, the suction nozzle 500 is allowed to be moved away from the adaptor 502. When a force greater than the drawing force of the spring member 546 is applied to the suction nozzle 500 in a direction in which the nozzle 500 may move away from the adaptor 502, the nozzle 500 can be removed from the adaptor 502. The current suction nozzle 500 may be exchanged with another suction nozzle 500 in the same method as the suction-nozzle exchanging method previously described in connection with the suction-nozzle exchanging device 160, and accordingly the method is not described any more here.

The cam follower 578 of the operable portion 576 cooperates with the cam surface 582 of the stationary cam 584 to provide a motion converting device which converts the vertical linear motion of the support shaft 53 into the pivotal motion of the lock lever 560. This motion converting device may be replaced with an operable portion 588 which is provided by a top end portion of the lock lever 560 that is located above the projection 566. In the latter case, the operable portion 588 may be manually pushed to pivot the lock lever 560 against the biasing force of the spring member 564 and thereby disengage the engaging projection 570 from the annular groove 556, so that the suction nozzle 500 is allowed to remove from the adaptor 502.

In the third embodiment, the adaptor 502 that provides at least a portion of the holder-holding member has the tapered hole 542 as the fitting hole, and the suction nozzle 500 as the component holder ahs the tapered shank 536 as the fitting shank. The lock lever 560 is a sort of lock member consisting of a rigid body. The annular groove 556 of the suction nozzle 500 functions as the engaging portion. The spring member 564 provides the elastic member; the operable portion 576 of the lock lever 560 provides the operable member; and the elastic member and the operable member cooperate with each other to provide the locked-state maintaining device. The operable portion 576 as the operable member is integral with the lock lever 560.

In the third embodiment, too, the suction nozzle 500 is effectively prevented from coming off the adaptor 502, even if a mounting head may be moved up at a high acceleration, or stopped at a high deceleration, during an EC mounting operation. In addition, even the spring member 546 whose elastic force has more or less deteriorated can be used yet, which leads to preventing a decrease of an operation rate of the EC mounting apparatus employing the mounting head that may possibly result from frequent exchanges of spring members 546. In addition, when the current suction nozzle 500 is exchanged with another suction nozzle 500, the lock lever 560 is displaced from its retracted position to its operative position. During this displacement, however, the removal of the new suction nozzle 500 from the adaptor 502 is effectively prevented because of the tight fitting of the tapered shank 536 and the tapered hole 542, and/or the elastic force of the spring member 546.

In the second embodiment shown in FIGS. 9 to 18, too, each of the attaching members 400 may be used with, in addition to the lock pin 420, a spring member 546, employed in the third embodiment, that elastically engages the tapered shank 408. In this case, when the holding jaws 398, 399 are attached to the attaching members 400, respectively, this spring member engages the tapered shank 408 after the tapered shank 408 fits in the tapered hole 404 and before the lock pin 420 moves to its operative position, so that the holding jaws 398, 399 are more effectively prevented from coming off the attaching members 400.

It is to be understood that the present invention may be embodied with various other changes, modifications and improvements, such as those described in SUMMARY OF THE INVENTION, which may occur to a person skilled in the art, without departing from the spirit and scope of the invention defined in the appended claims.

What is claimed is:

1. An electric-component holding apparatus comprising:
a component holder which holds an electric component and which includes an engaging portion;
a holder-holding member to which the component holder is detachably attached;
a lock member which consists of a substantially rigid body, and which is supported by the holder-holding member such that the lock member is movable relative to the holder-holding member, and is engaged with the engaging portion of the component holder to lock the component holder to the holder-holding member; and
a locked-state maintaining device which includes an operable member and an elastic member and which maintains, owing to an elastic force of the elastic member, a locked state in which the lock member is engaged with the engaging portion of the component holder,
wherein the locked-state maintaining device prevents the lock member to transmit any components of an external force to the operable member to increase an amount of elastic deformation of the elastic member, when the external force to cause the component holder to move away from the holder-holding member is exerted to the component holder in the locked state, and the locked-stated maintaining device allows the lock member to be moved, due to the external force, relative to the holder-holding member, disengaged from the engaging portion of the component holder and unlocked from the locked state, when the operable member is operated by an operating force to increase the amount of elastic deformation of the elastic member.

2. The electric-component holding apparatus according to claim 1, wherein the component holder comprises a suction nozzle which applies a negative pressure to the electric component and thereby holds the component.

3. The electric-component holding apparatus according to claim 1, wherein the component holder comprises a plurality of holding jaws which cooperate with each other to hold the electric component.

4. The electric-component holding apparatus according to claim 1, wherein the holder-holding member comprises a cylindrical portion which has an inner fitting hole and additionally has a through-hole radially formed therethrough to open, at an inner one of opposite open ends thereof, in the inner fitting hole, and the component holder comprises a fitting shank which is fitable in the inner fitting hole of the holder-holding member and which has an engaging recess as the engaging portion of the component holder, wherein the lock member is held in the through-hole of the cylindrical portion such that the lock member is movable in the through-hole in an axial direction of the through-hole parallel to an axis line thereof and is substantially immovable in a direction perpendicular to the axial direction, and the lock member has a dimension which assures that the lock member can simultaneously project out of both the opposite open ends of the through-hole, and wherein the locked-state maintaining device comprises (a) a sleeve which moveably fits on an outer circumferential surface of the cylindrical portion of the holder-holding member, and is movable to an operative position thereof in which the sleeve faces the through-hole and keeps the lock member engaged with the engaging recess of the component holder, and to a retracted position thereof in which the sleeve allows the lock member to be disengaged from the engaging recess, (b) the elastic member which biases the sleeve to the operative position thereof, and (c) the operable member which receives the operating force to move the sleeve to the retracted position thereof against the elastic force of the elastic member.

5. The electric-component holding apparatus according to claim 4, wherein the lock member comprises a ball which has a diameter greater than a length of the through-hole in the axial direction thereof.

6. The electric-component holding apparatus according to claim 4, wherein the operable member is integral with the sleeve.

7. The electric-component holding apparatus according to claim 4, wherein the inner fitting hole comprises a tapered hole having an inner tapered surface, and wherein the fitting shank comprises a tapered shank having an outer tapered surface which is fitable in the inner tapered surface of the tapered hole.

8. The electric-component holding apparatus according to claim 1, wherein the holder-holding member has a fitting hole and additionally has a holding hole which crosses the fitting hole while partly overlapping, in space, the fitting hole, and the component holder comprises a fitting shank which is fitable in the fitting hole of the holder-holding member and which has an engaging recess as the engaging portion of the component holder, wherein the lock member comprises a lock bar which is held in the holding hole of the holder-holding member such that the lock bar is movable in the holding hole in an axial direction of the holding hole parallel to an axis line thereof, and is substantially immovable in a direction perpendicular to the axial direction, and the lock bar is movable to an operative position thereof in which the lock bar is engaged with the engaging recess of the component holder, and to a retracted position thereof in which the lock bar is disengaged from the engaging recess, and wherein the locked-state maintaining device comprises (a) the elastic member which biases the lock bar to the operative position thereof, and (b) the operable member which receives the operating force to move the lock bar to the retracted position thereof against the elastic force of the elastic member.

9. The electric-component holding apparatus according to claim 8, wherein the operable member is integral with the lock bar.

10. The electric-component holding apparatus according to claim 8, wherein the lock bar comprises a lock pin which has a circular transverse cross section.

11. The electric-component holding apparatus according to claim 1, wherein the holder-holding member comprises one of a fitting hole and a fitting shank fitable in the fitting hole, and the component holder comprises the other of the fitting hole and the fitting shank, wherein the lock member comprises a lock lever which is supported by the holder-holding member such that the lock lever is pivotable, about an axis line perpendicular to a common line of the fitting hole and the fitting shank, to an operative position thereof in which the lock lever is engaged with the engaging portion of the component holder to prevent the component holder from moving away from the holder-holding member, and to a retracted position thereof in which the lock lever is disengaged from the engaging portion, and wherein the locked-state maintaining device comprises (a) the elastic member which biases the lock lever to the operative position thereof, and (b) the operable member which receives the operating force to move the lock lever to the retracted position thereof against the elastic force of the elastic member.

12. The electronic-component holding apparatus according to claim 11, wherein the operable member is integral with the lock lever.

13. An electric-component holding apparatus, comprising:

a component holder which holds an electric component and which includes an engaging portion;

a holder-holding member to which the component holder is detachably attached;

a lock member which consists of a substantially rigid body, and which is supported by the holder-holding member such that the lock member is movable relative to the holder-holding member, and is engaged with the engaging portion of the component holder to lock the component holder to the holder-holding member; and a locked-state maintaining device which includes an operable member and an elastic member and which maintains, owing to an elastic force of the elastic member, a locked state in which the lock member is engaged with the engaging portion of the component holder, wherein the operable member is movable, relative to the holder-holding member, to an operative position thereof in which the operable member does not allow the lock member to be disengaged from the engaging portion of the component holder, and to a rectracted position thereof in which the operable member allows the lock member to be disengaged from the engaging portion, wherein the elastic member biases the operable member to the operative position thereof, and wherein the operable member receives an operating force to move to the retracted position thereof against the elastic force of the elastic member.

* * * * *